(12) United States Patent
Yip

(10) Patent No.: US 11,984,432 B2
(45) Date of Patent: May 14, 2024

(54) SEMICONDUCTOR CHIP STACK MODULE AND METHOD OF FABRICATING THE SAME

(71) Applicant: Unity Power Technology Limited, Kowloon (HK)

(72) Inventor: Kuk Fong Yip, Sheung Shui (HK)

(73) Assignee: Unity Power Technology Limited, Kowloon (HK)

( * ) Notice: Subject to any disclaimer, the term of this patent is extended or adjusted under 35 U.S.C. 154(b) by 156 days.

(21) Appl. No.: 17/533,421

(22) Filed: Nov. 23, 2021

(65) Prior Publication Data

US 2023/0163105 A1 May 25, 2023

(51) Int. Cl.
*H01L 25/07* (2006.01)
*H01L 23/00* (2006.01)
*H01L 25/00* (2006.01)

(52) U.S. Cl.
CPC ............ *H01L 25/071* (2013.01); *H01L 24/32* (2013.01); *H01L 24/33* (2013.01); *H01L 24/37* (2013.01); *H01L 24/48* (2013.01); *H01L 24/73* (2013.01); *H01L 24/83* (2013.01); *H01L 24/84* (2013.01); *H01L 24/85* (2013.01); *H01L 25/50* (2013.01); *H01L 2224/32145* (2013.01); *H01L 2224/32225* (2013.01); *H01L 2224/33181* (2013.01); *H01L 2224/3702* (2013.01); *H01L 2224/48225* (2013.01); *H01L 2224/73263* (2013.01); *H01L 2224/73265* (2013.01)

(58) Field of Classification Search
CPC ....... H01L 25/071; H01L 25/50; H01L 24/32; H01L 24/33; H01L 24/37; H01L 24/48; H01L 24/73; H01L 24/83; H01L 24/84; H01L 24/85
USPC .......................................................... 257/777
See application file for complete search history.

(56) References Cited

U.S. PATENT DOCUMENTS

2018/0005987 A1* 1/2018 Hiner ..................... H01L 24/96

FOREIGN PATENT DOCUMENTS

CN              115241153 A  * 10/2022  ............ H01L 25/00

* cited by examiner

*Primary Examiner* — Jasmine J Clark
(74) *Attorney, Agent, or Firm* — Warner Norcross + Judd LLP

(57) ABSTRACT

A semiconductor chip stack module that includes a substrate, two first semiconductor chips supported by the substrate, and a second semiconductor chip stacked on both of the two first semiconductor chips. The second semiconductor chip is electrically connected to both of the two first semiconductor chips by a conductive paste configured between the second semiconductor chip and both of the two first semiconductor chips. As multiple standard chips are stacked in the power module, and their number as well as the connection methods (e.g. series or parallel) are flexible so that the user can choose which electric characteristic(s) to be increased in the power module with the stacked chips.

14 Claims, 42 Drawing Sheets

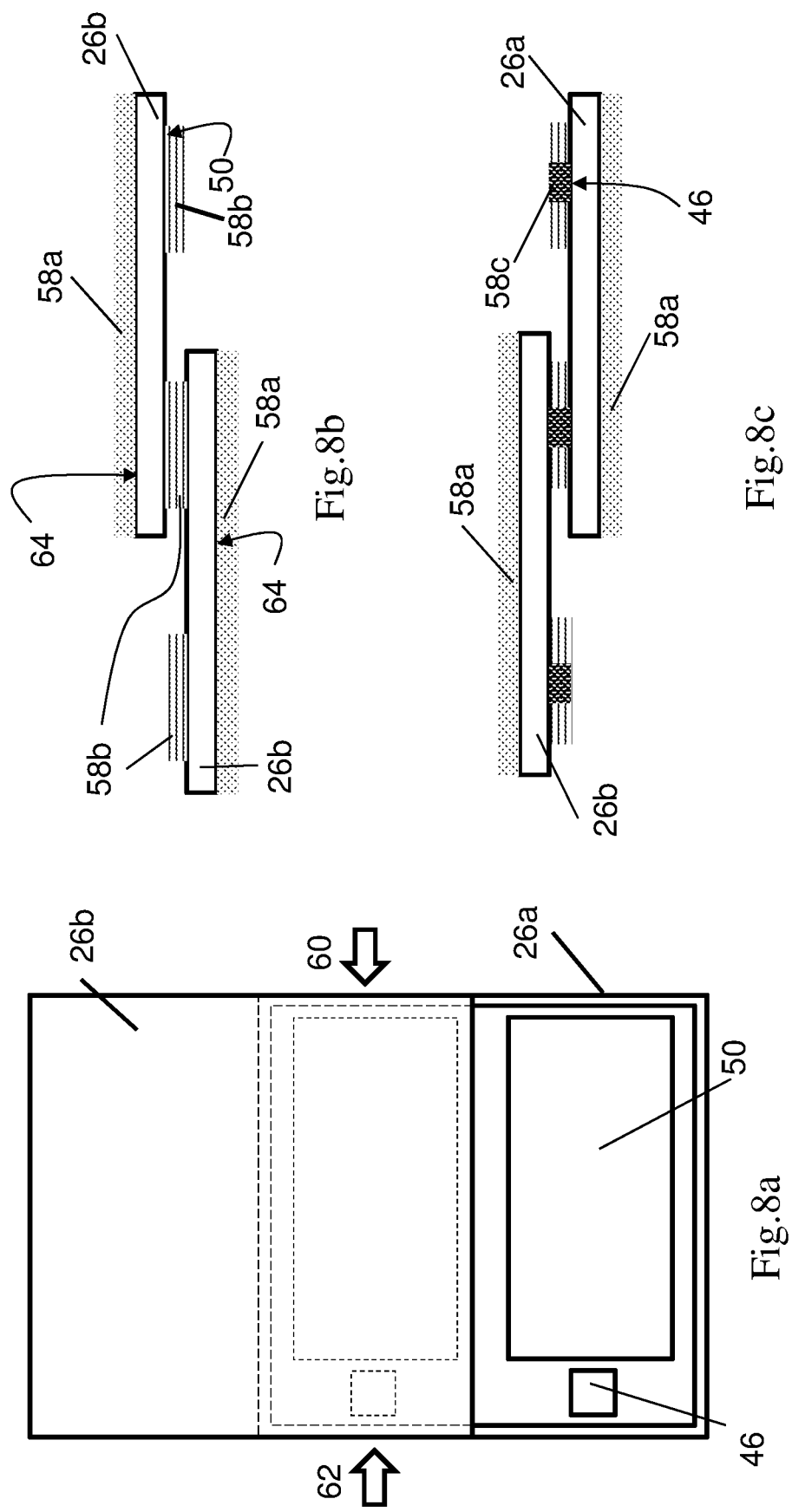

32b

32b

32b

32c

32c

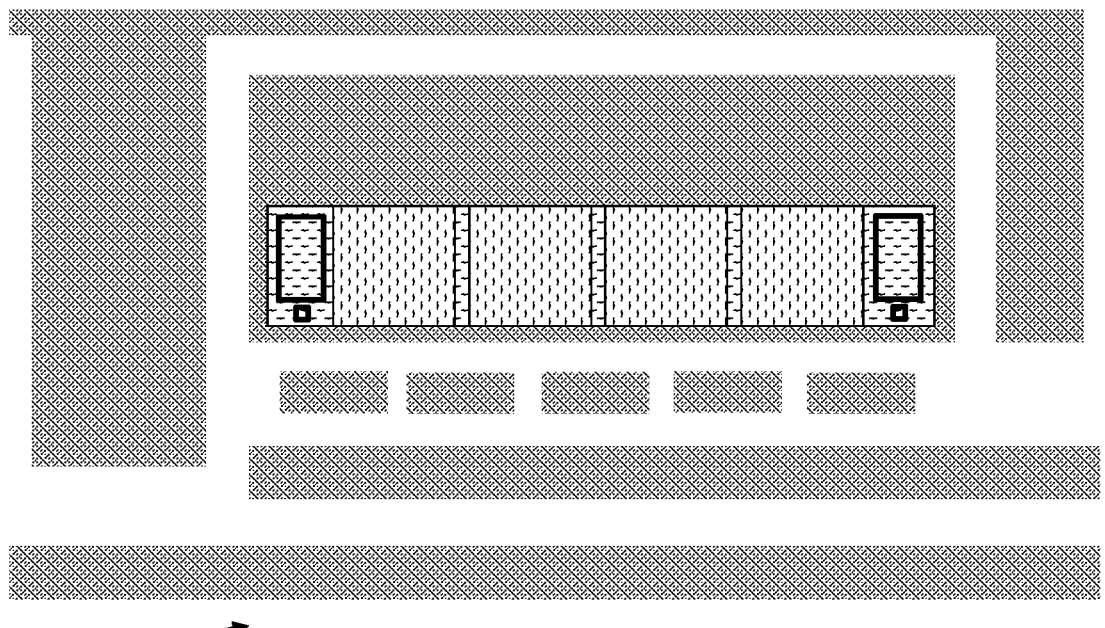
32d →   Fig.16a
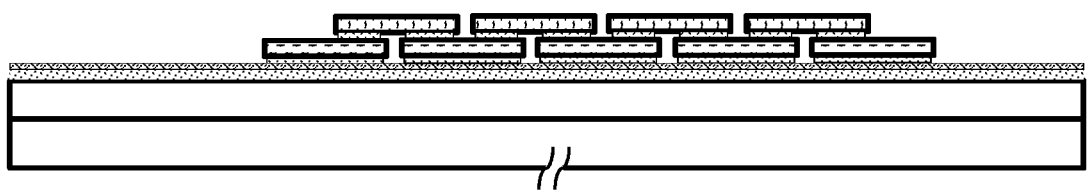
Fig.16b

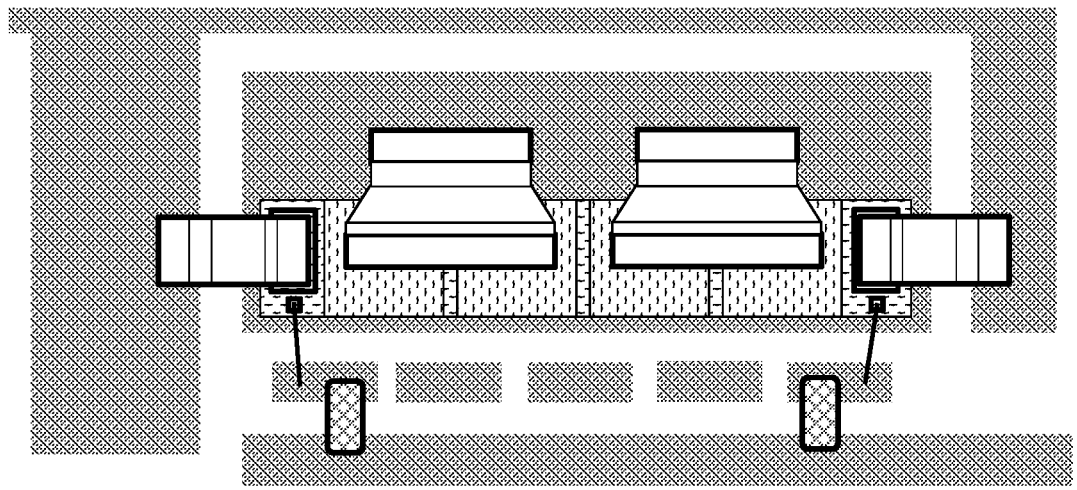
32d
Fig.17a
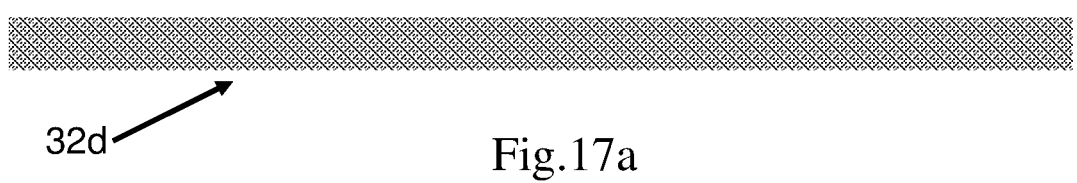
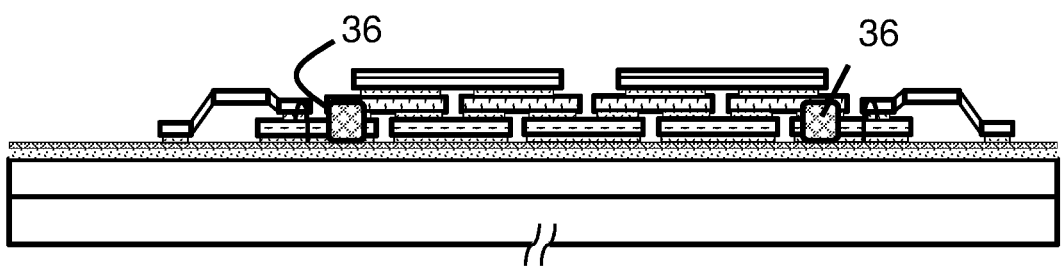
Fig.17b

132b

132b

132b

132c

132c

132c

132d

132d

SEMICONDUCTOR CHIP STACK MODULE AND METHOD OF FABRICATING THE SAME

FIELD OF INVENTION

This invention relates to semiconductor devices, and in particular to multi-chip semiconductor modules.

BACKGROUND OF INVENTION

Green energy applications such as electric vehicle, solar power, wind power, and traction control require a very high current power device in a given power module package with limited footprint. Typically, such power module packages contain Silicon-based IGBTs (Insulated Gate Bipolar Transistor) or SiC (Silicon Carbide) MOSFETs, and are intended for high current power electronics such as converters/inverters, motor drives, industrial electronics and high performance electric vehicle systems. One well-known family of such power module package is the 62 mm power modules, which have a broad product spectrum as customers can choose from different voltage classes, power ratings as well as different chip components. For example, a commonly used MOSFET chip in 62 mm power modules may have the electrical specification of 1200V/50 A and 1200V/100 A to produce a power module with current rating of 300 A, 400 A, 500 A or higher, depending on the number of chips that are electrically connected in parallel.

However, traditional power modules require customized ceramic substrate design known as Direct bonded copper (DBC) or Active Metal Brazed (AMB) to cater for different current rating requirements and different chip components. The shortcomings with the customized ceramic substrate design include that a particular structure design is needed for each specific power module, and when there is design target miss or requirement change, the whole design needs to be changed too.

Furthermore, it is conventionally known to stack multiple chips in a power module to allow the maximum current density to increase and provide flexibility to change performance. For silicon devices (not SiC), however, heat dissipation of stacked chips is a major concern. On the other hand, with a thermal conductivity more than three times of silicon device (1.5 W/cmK for Si and 4.9 W/cmK for SiC), SiC device is a much better candidate to enable multi-layers and multi-chips power module package.

SUMMARY OF INVENTION

In the light of the foregoing background, it is an object of the present invention to focuses on the above-mentioned weakness and propose alternative power modules with stacking structures to provide a higher power density in the power module.

The above object is met by the combination of features of the main claim; the sub-claims disclose further advantageous embodiments of the invention.

One skilled in the art will derive from the following description other objects of the invention. Therefore, the foregoing statements of object are not exhaustive and serve merely to illustrate some of the many objects of the present invention.

Accordingly, the present invention, in one aspect is a semiconductor chip stack module that includes a substrate, two first semiconductor chips supported by the substrate, and a second semiconductor chip stacked on both of the two first semiconductor chips. The second semiconductor chip is electrically connected to both of the two first semiconductor chips by a conductive paste configured between the second semiconductor chip and both of the two first semiconductor chips.

In some embodiments, the semiconductor chip stack module further includes a metal clip bonding that electrically connecting the second semiconductor chip to the substrate.

In some embodiments, the second semiconductor chip is a MOSFET chip having a source at its top face. The metal clip bonding electrically connects the source of the MOSFET chip to the substrate.

In some embodiments, the at least one of the two first semiconductor chips is electrically connected at its top face to the substrate by a further metal clip bonding.

In some embodiments, the second semiconductor chip further has a gate at its top face; the gate being electrically connected to the substrate via wire bonding.

According to an embodiment, the second semiconductor chip is connected in series to both of the first semiconductor chips.

According to an embodiment, the second semiconductor chip and the first semiconductor chips have a same pin layout, and corresponding pins in the second semiconductor and the first semiconductor chips face a same direction.

According to another embodiment, the second semiconductor chip is connected in parallel to both of the first semiconductor chips.

According to another embodiment, the second semiconductor and the first semiconductor chips have a same pin layout. The second semiconductor is flipped with respect to the first semiconductor chips such that corresponding pins in the second semiconductor and the first semiconductor chips face opposite directions.

In some embodiments, the second semiconductor chip is evenly positioned between the two first semiconductor chips in a direction perpendicular to a stacking direction.

In some embodiments, the second semiconductor chip and the two first semiconductor chips all have identical dimensions and have identical pin layouts.

In an alternative embodiment, the semiconductor chip stack module further contains a further second semiconductor chip supported together by a spacer configured on the substrate and one of the two first semiconductor chips.

In a further embodiment, the semiconductor chip stack module further contains a further second semiconductor chip, and a third semiconductor chip; the third semiconductor chip being supported by the second semiconductor chip and the further second semiconductor chip.

In some embodiments, the substrate is divided into four quadrants. Each quadrant of the substrate individually includes two said first semiconductor chips and one said second semiconductor chip.

In another aspect of the invention, there is provided a semiconductor chip stack module that includes a substrate, two first semiconductor chips supported by the substrate, and a second semiconductor chip stacked on both of the two first semiconductor chips. The second semiconductor chip and the first semiconductor chips all have substantially the same footprints.

In another aspect of the invention, there is provided a method of fabricating a chip stack module. The method includes the steps of preparing a substrate; applying a first conductive paste on the substrate; mounting two first semiconductor chips on the substrate by the first conductive paste; applying second conductive pastes respectively on a top side of each of the two first semiconductor chips; and stacking a second semiconductor chip on both of the two first semiconductor chips by the second conductive pastes.

In some embodiments, the method further includes the step of electrically connecting a top side of the second semiconductor chip to the substrate by a metal clip bonding.

In some embodiments, the connecting step further includes applying a third conductive paste on the top side of the second semiconductor chip, and mounting a metal clip to the top side by the third conductive paste.

In some embodiments, in the applying steps the first and second conductive pastes are printed respectively on the substrate and on the top side of the first semiconductor chips, and then dried.

Embodiments of the invention therefore utilize a standard chip (i.e., a same MOSFET chip) as the building block of power modules with different functions and requirements. Multiple standard chips are stacked in the power module, and their number as well as the connection methods (e.g. series or parallel) are flexible so that the user can choose which electric characteristic(s) to be increased in the power module with the stacked chips. Conductive paste printing (e.g. Ag) and metal clip bonding (e.g. Cu) are implemented to allow the multiple standard chips to connect together as a matrix and stack into multiple layers. The use of a standard chip as the building block simplifies the design process of the power module, and more importantly any existing design can be easily modified by rearranging the standard chips in different stack structure, and/or add or remove a number of standard chips, if alternative performance/functions are required. This saves tremendous time and effort that are otherwise required as in traditional ceramic substrate designs when variations are sought.

Some of the embodiments of the invention configure a top MOSFET chip to sit on exactly two bottom MOSFET chips. This allows both current and heat to spread downward even more uniformly. In addition, because of the use of conductive paste (e.g. Ag paste) and metal (e.g. Cu) clip bonding, in some embodiments the top chip have a portion of chip hanging without support.

BRIEF DESCRIPTION OF FIGURES

The foregoing and further features of the present invention will be apparent from the following description of preferred embodiments which are provided by way of example only in connection with the accompanying figures, of which:

FIG. 8*a* is a top view of a part of the chip stacking structure in the first quadrant of FIGS. 6*a*-7*b*.

FIG. 8*b* is a side view of the chip stacking structure in FIG. 8*a* along the direction shown by the arrow 60.

FIG. 8*c* is a side view of the chip stacking structure in FIG. 8*a* along the direction shown by the arrow 62.

FIGS. 16*a* and 16*b* are respectively a top view and a side view of the fourth quadrant of the power module of FIG. 1, in which both top chips and bottom chips are shown.

FIGS. 17*a* and 17*b* are respectively a top view and a side view of the fourth quadrant of the power module of FIG. 1, in which the top chips, the bottom chips, metal clips, wire bonding, and passive components are shown.

In the drawings, like numerals indicate like parts throughout the several embodiments described herein.

DETAILED DESCRIPTION OF THE PREFERRED EMBODIMENTS

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

As used herein and in the claims, "couple" or "connect" refers to electrical coupling or connection either directly or indirectly via one or more electrical means unless otherwise stated.

Terms such as "horizontal", "vertical", "upwards", "downwards", "above", "below" and similar terms as used herein are for the purpose of describing the invention in its normal in-use orientation and are not intended to limit the invention to any particular orientation.

Figure 1:
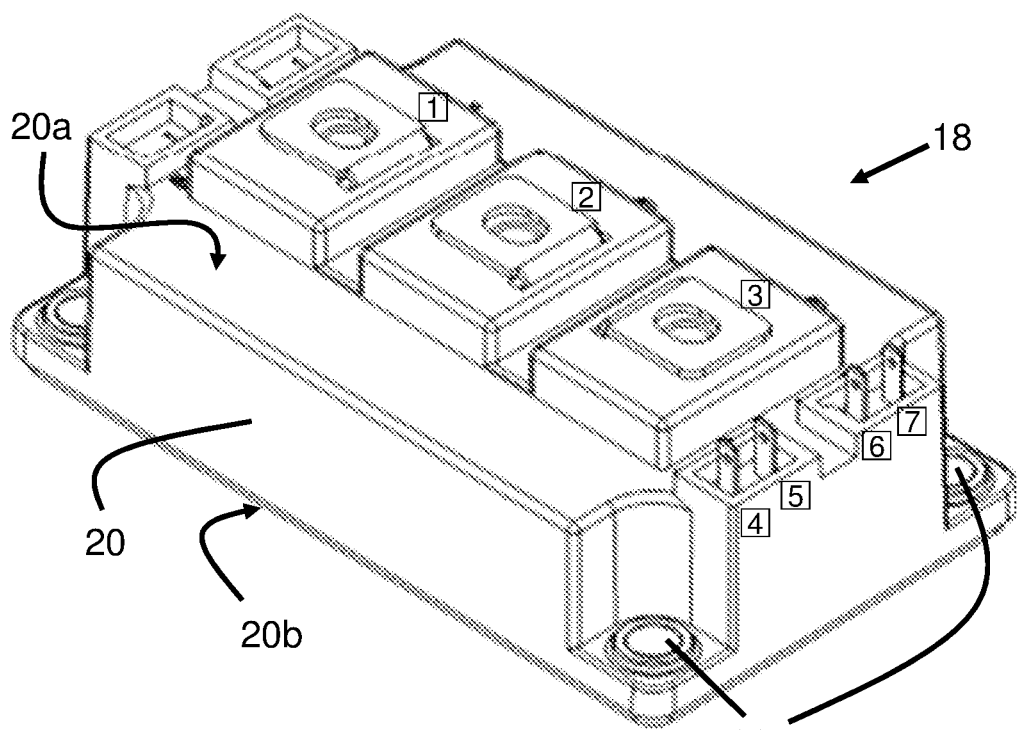
FIG. 1 shows the perspective view of a 62 mm power module according to a first embodiment of the invention.

FIG. 1 shows the appearance of a 62 mm power module 18 according to a first embodiment of the invention. The power module 18 contains an industry standard 62 mm housing 20 protecting the sensitive electronic components in the power module 18 from mechanical and environmental interference. The housing 20 consists of a cover 20a and a base plate 20b, which are fastened by multiple nuts 22. On the housing 20, there are in total seven electric terminals (as shown by pin numbers 1-7 in FIG. 1) configured for electrical connection of the power module 18 to external devices. Each of the electric terminals is formed by a respective conductor (not shown, e.g. metal conducting pins) soldered to a sole substrate (not shown in FIG. 1). The substrate is received in the housing 20 and mounted to its base plate 20b, where the substrate carries electrical components that achieve intended functions of the power module 18. As a skilled person would understand, the housing 20 contains additional, spare structures (not used in power module 18) for mounting potential electric terminals with a total number of electric terminals supported being up to eleven. The housing 20 of the power module 18 and its exterior structures/features will not be described in any further details herein.

Figure 2A:
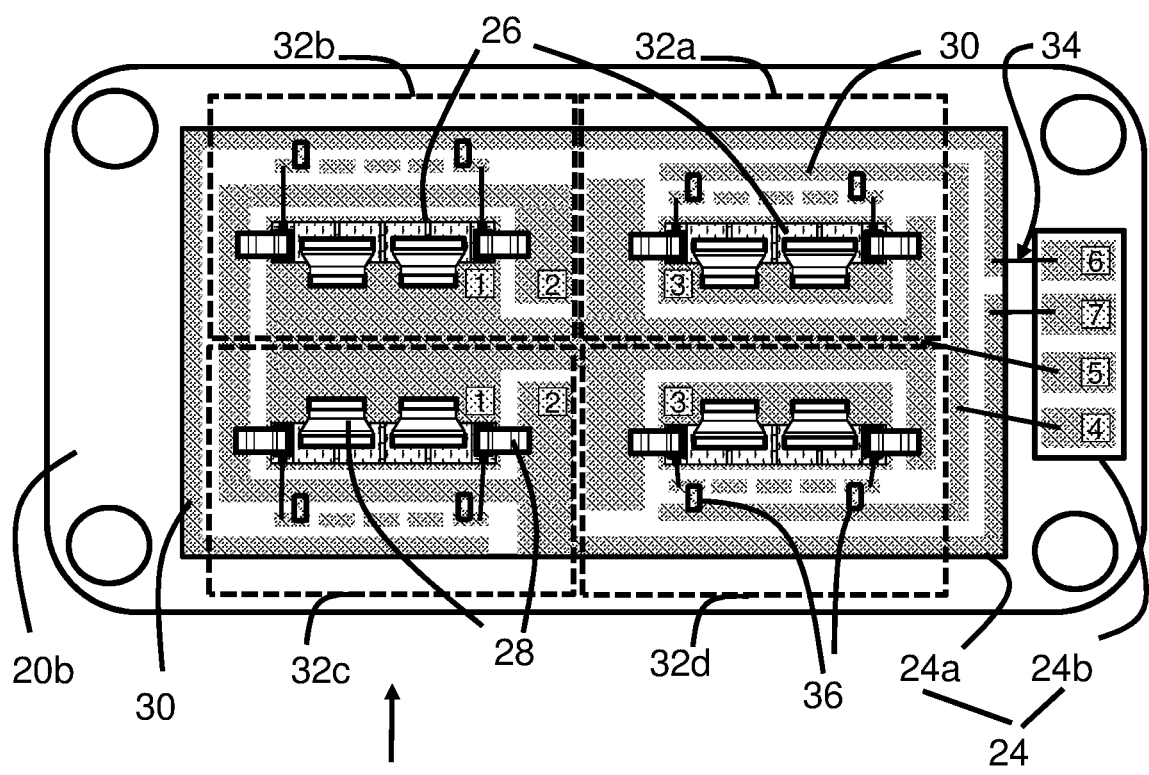
FIG. 2*a* is the interior layout view of MOSFET chips and the substrate in the power module of FIG. 1.

Turning to FIG. 2a, which shows the internal structure of the power module 18 in FIG. 1 as it is supported on the base plate 20b of the housing 20. The internal structure as shown includes all components and connections required for functions of the power module 18, and the power module 18 shown as uncovered in FIG. 2 is ready for external electrodes bonding. The internal structure includes essentially two ceramic substrates 24 formed on top of the base plate 20b, between which a first substrate 24a is to hold four sub-modules of the power module, and a second substrate 24b is for connection of four electric terminals. A plurality of SiC MOSFET chips 26 mounted a first substrate 24a in a stacked manner, and a plurality of passive components 36 which are resistors. Copper clips 28 are configured to connect top surfaces of MOSFET chips 26 to conducting traces 30 on the first substrate 24a. These electrical components will be described in more details afterward. It should be noted that the power module contains four sub-modules as mentioned above, and each of the sub-modules is at a separate location on the first substrate 24a, where there are four quadrants 32a, 32b, 32c and 32d of the first substrate 24a that can be defined to respectively contain each of the four sub-modules. The MOSFET chips 26 in all the sub-modules in the four quadrants 32a-32d are surrounded by the conducting traces 30 which is part of the first substrate 24a, and the conducting traces 30 provide interconnecting of four sub-modules, as well as connecting the MOSFET chips 26 to the seven electric terminals mentioned above. From FIG. 2a one can see that some of the conducting traces 30 on the first substrate 24 are connected to those on the second substrate 24b by bonding wires 34, and the passive components 36 also interconnect some conducting traces 30 on the first substrate 24a.

Figure 2B:
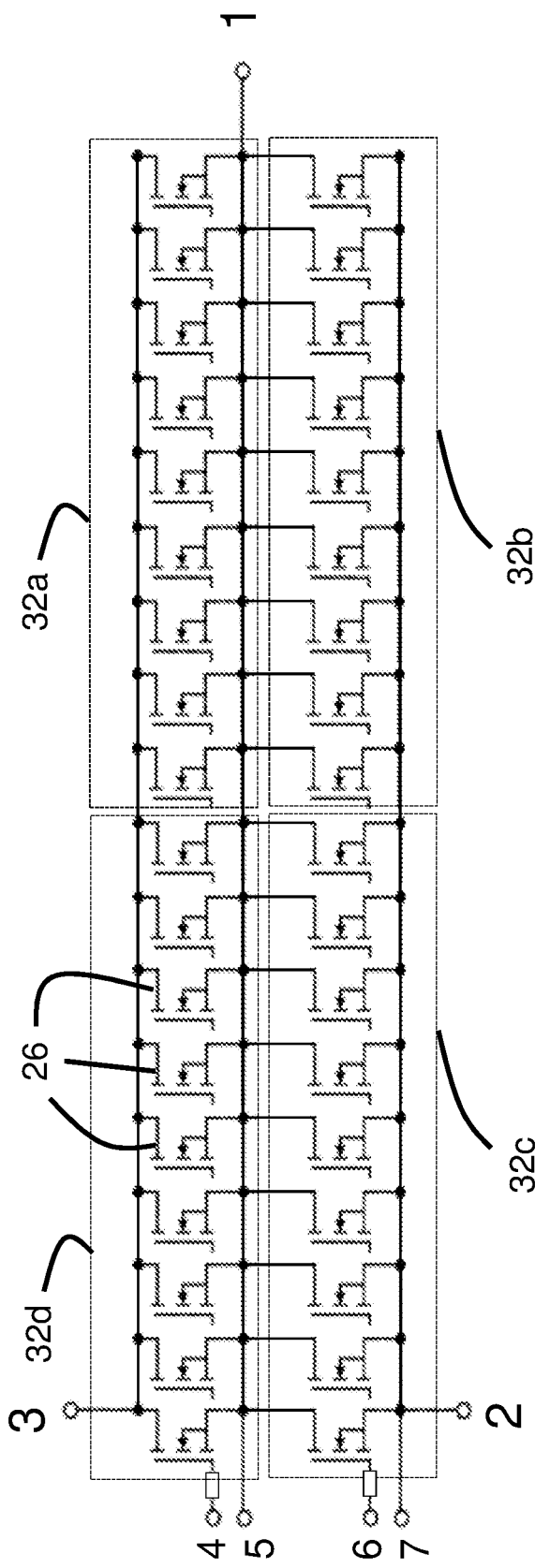
FIG. 2*b* shows the equivalent circuit of the power module of FIG. 1.

The power module 18 is a half-bridge 62 mm power module suitable for high power applications such as electric vehicle, solar power, wind power, and traction control etc. Among the four sub-modules, two belong to a high side of the half bridge (which are the ones in a first quadrant 32a and in a fourth quadrant 32d), where the other two belong to a low side of the half bridge (which are the ones in a second quadrant 32b and in a third quadrant 32c). An equivalent circuit of the power module 18 is shown in FIG. 2b, in which one can see that the sub-modules in the first quadrant 32a and the fourth quadrant 32d are connected in parallel, and the same is between sub-modules in the second quadrant 32b and the third quadrant 32c. However, the sub-module in the first quadrant 32a is connected in series with the sub-module in the second quadrant 32b, and the sub-module in the third quadrant 32c is connected in series with the sub-module in the fourth quadrant 32d.

Figure 3:
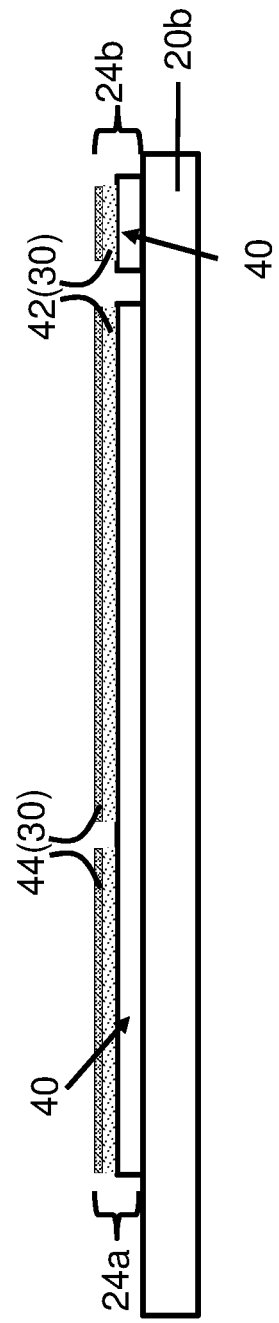
FIG. 3 shows the structural view of the substrate on the power module base plate.

All the MOSFET chips 26 in the power module 18 are bonded to conducting traces 30 on the first substrate 24 as mentioned above. The structure of the substrates 24 are shown in FIG. 3, and they are mounted to the base plate 20b made of Copper (Cu) or Aluminum-Silicon Carbide (Al-SiC). In each of the first substrate 24a and the second substrate 24b, there is ceramic layer 40 which is made from Direct Bonded Copper (DBC) or Active Metal Brazed (AMB). On top of ceramic layer 40 there is formed a copper layer 42, and on the copper layer 42 there is formed a nickel phosphorus (NiP) and/or gold (Au) plating layer 44. Both the copper layer 42 and the plating layer 44 are then patterned and etched so that they are physically and electrically separated from each other to form the conducting traces 30. It should be noted that as there are two separated substrates 24 in the power module 18 shown in FIG. 2a, the two substrates 24 can only be connected with each other by using bonding wires 34 to connect to the conducting traces 30 of each of the substrates 24.

Figure 4A:
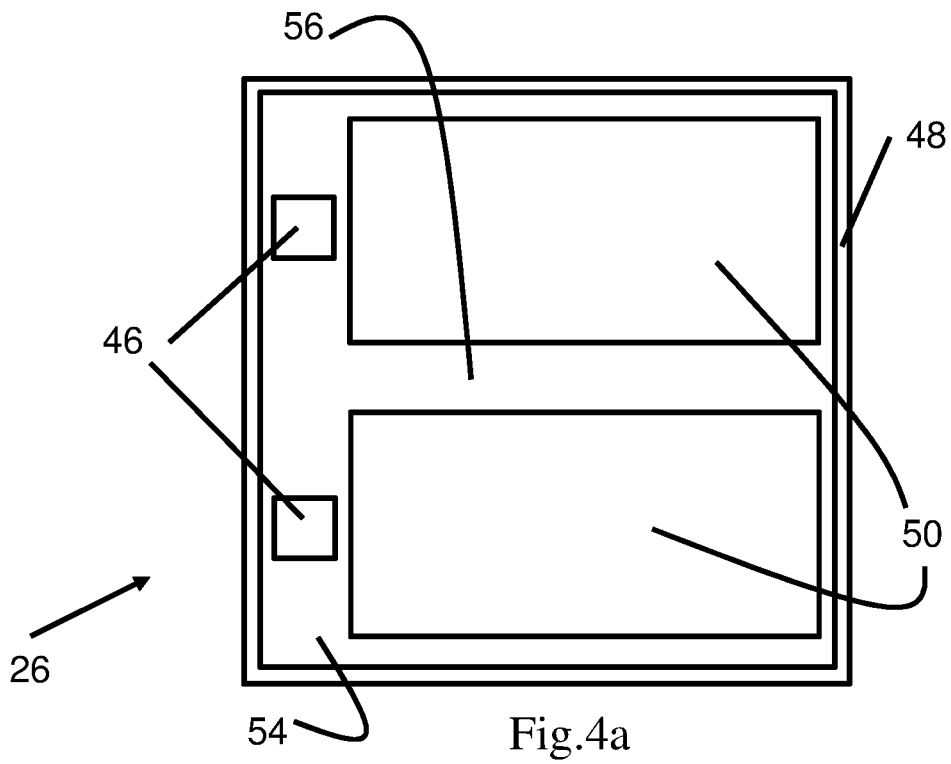
FIGS. 4*a* and 4*b* are respectively a fully-processed chip top view showing the bonding pads and a partially-processed chip top view showing gate connection of a MOSFET chip in the power module of FIG. 1.
Figure 4B:
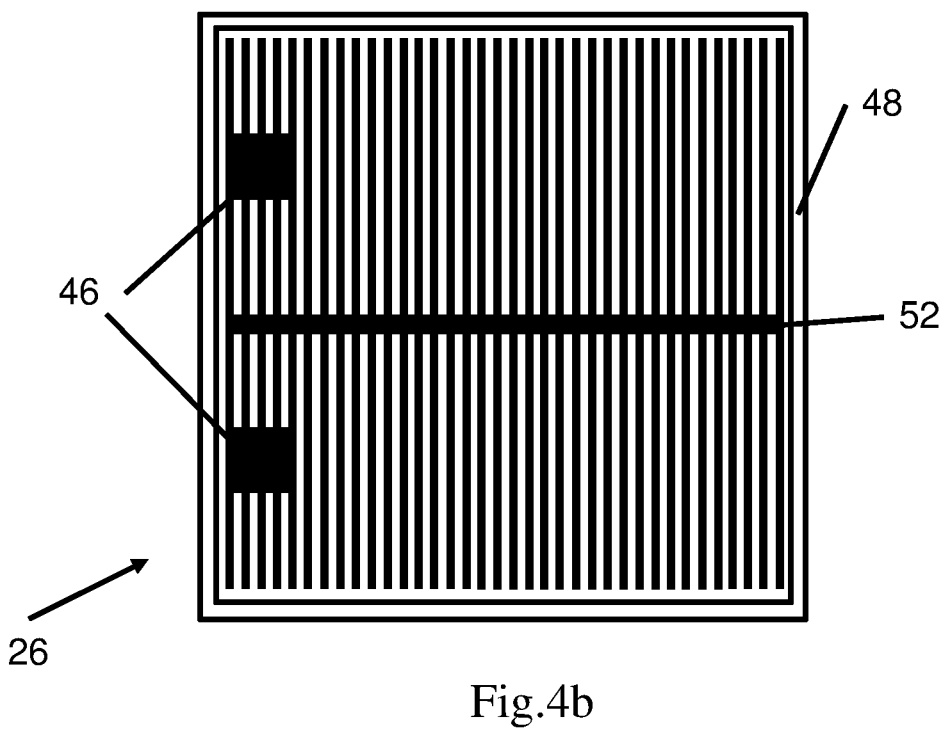

Each of the four quadrants 32a-32d consists of nine MOSFET chips 26, and all the MOSFET chips 26 in the power module 18 are identical as they have the same footprint, and the same pin layout. Therefore, the MOSFET chips 26 are standard building blocks of the power module 18. The appearance of a MOSFET chip 26 is shown in FIGS. 4a and 4b, where one can see that on the top face of the MOSFET chip 26 there are two source pads 50 which occupy most area of the top face. The source pads 50 are each in a rectangle shape and they have identical size. The source pads 50 should have an area as large as possible to distribute the current more evenly across the MOSFET chip 26. The source pads 50 provide an electrical connection to the source of the MOSFET. Beside each of the source pads 50 there is a gate pad 46 that has a much smaller size compared to the source pad 50, and the gate pads 46 each have a square or rectangle shape. The gate pad 46 provide an electrical connection to the gate of the MOSFET. The distance between centers (not shown) of the source pads 50 is equal to that between centers (not shown) of the gate pads 46. Between the two source pads 50 there is a central isolation street 56. The rest part of the top face surrounding the source pads 50 and the gate pad 46 is deposited with a passivation layer 54. At the perimeter of the MOSFET chip 26 there is a termination ring 48. Within the MOSFET chip 26 between the top face and the bottom face, there is embedded a gate bus network 52 that connects the gate of each MOSFET cell (not shown) in the MOSFET chip 26 electrically within the whole chip to the two gate pads 46. At the bottom side of the MOSFET chip 26 a drain (not shown) is formed which occupies the entire area of the bottom side The MOSFET chips 26 can have the most used electrical specification, for example 650V/50 A, 650V/100 A, 750V/50 A, 750V/100 A, 1200V/50 A and 1200V/100 A. Of course, other specifications are possible for the MOSFET chips 26, and the main considerations in choosing the electrical specification include: (1) easy to multiply; (2) not too big due to defect yield concerns; (3) not too small so as to give room for bonding. To illustrate an example, if the MOSFET chips 26 have the specification of 1200V/100 A, then the chip size (i.e. the entire size in FIG. 4a or 4b) is in the range of 18 mm$^2$ to 35 mm$^2$. To allow copper wire bonding or Ag printing, a size of 0.2 mm×0.2 mm to 0.5 mm×0.5 mm of the gate pad 46 is large enough. In other word, the two gate pads 46 in the MOSFET chip 26 just occupy around 0.2% to 3% of total chip size. The width of the termination ring 48 is required to be 0.1 to 0.2 mm to sustain the electric field, where the central isolation street 56 requires 0.4 to 1.0 mm to cater of misalignment in chip stacking. A thickness of the MOSFET chip 26 is in the range of 100 μm and 350 μm. In a preferred implementation the MOSFET chip 26 has a size of 5 mm×5 mm, and the termination ring 48 has a width of 0.15 mm. The source pad 50 has a size of 3.6 mm×1.5 mm and the gate pad 46 has a size of 0.3 mm×0.3 mm. The central isolation street 56 has a width of 1 mm. The thickness of the MOSFET chip 26 is 200 μm.

Figure 5A:
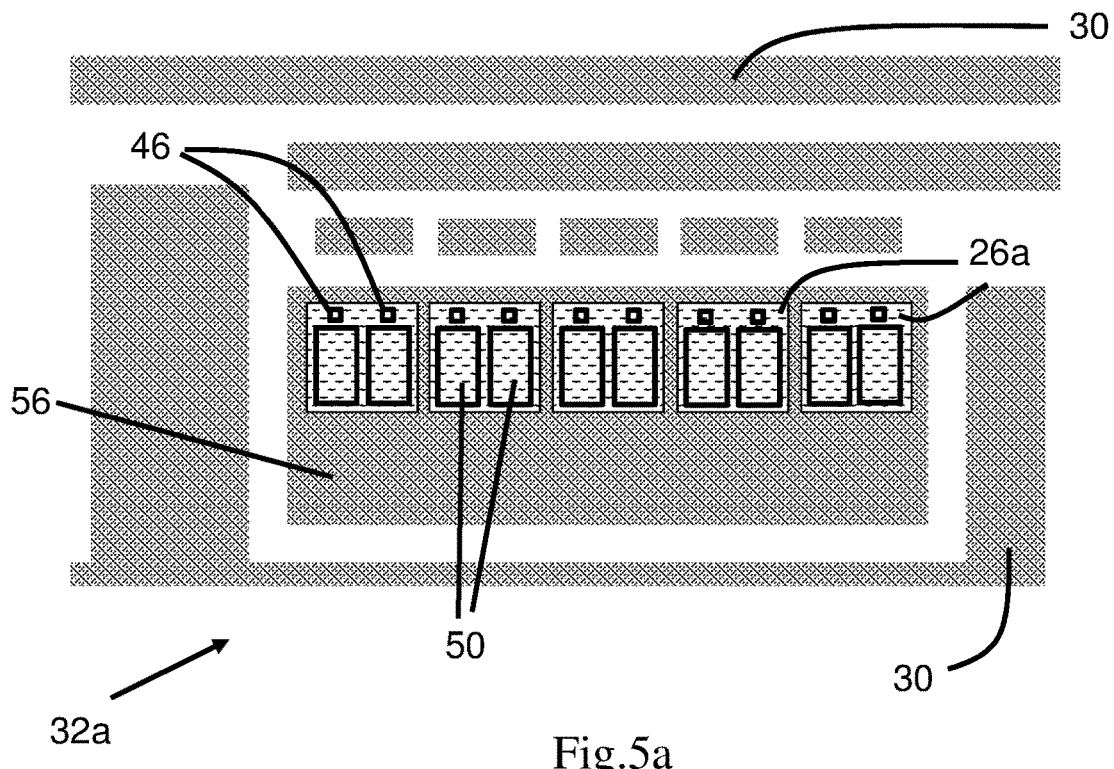
FIGS. 5*a* and 5*b* are respectively a top view and a side view of a first quadrant of the power module of FIG. 1, in which only bottom chips are shown as bonded to the substrate.
Figure 5B:
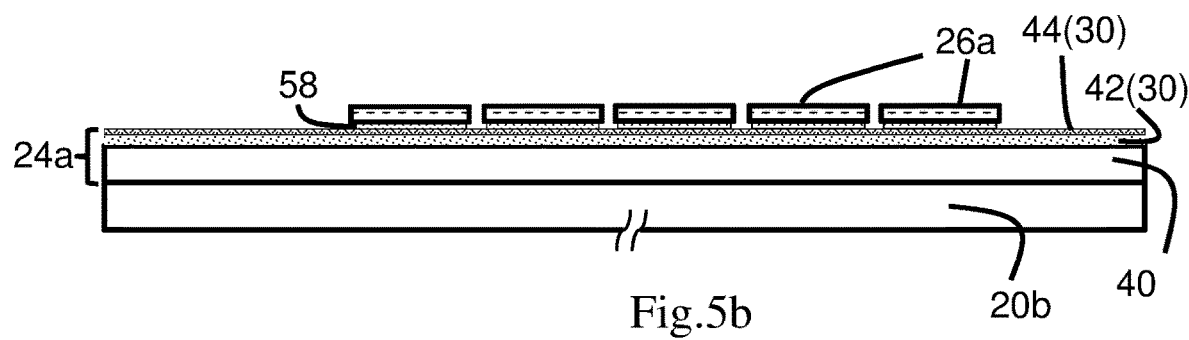

The stacked structure of the MOSFET chips 26 in each of the four quadrants 32a-32d will now be described. FIGS. 5a-7b show the different views of the first quadrant 32a of the MOSFET chip 26 when a part of the components or the whole components are mounted on the first substrate 24a. As best seen in FIGS. 5a-5b, the above-mentioned nickel phosphorus and/or gold plating layers 44, together with the copper layer 42 on the first substrate 24a surface form various conducting traces 30 and a drain area 56, and are isolated by the ceramic layer 40. The first substrate 24a, which sits on the base plate 20b, consists of ceramic layers 40, copper layers 42 and the nickel phosphorus and/or gold plating layers 44 as mentioned above. The drain area 56 has a rectangular shape and is surrounded (but separated) by a single conducting trace 30 along three sides of the drain area 56. Five bottom MOSFET chips 26a are evenly distributed on the drain area 56 along a length thereof. In other words, the distance between any two adjacent bottom MOSFET chips 26a is the same. To obtain the best effect, the source pad 50 spacing between two adjacent bottom MOSFET chips 26a must be the same as two source pads 50 within any one of the same bottom MOSFET chip 26a. All the bottom MOSFET chips 26a have their top side (i.e. the side as shown in FIG. 4a) facing upward. As such, on the top sides of the bottom MOSFET chips 26a there are two gate pads 46 and two source pads 50. The drain (not shown) of the bottom MOSFET chips 26*a* are physically and electrically bonded to the nickel phosphorus and/or gold plating layers 44 by Ag pastes 58.

Figure 6A:
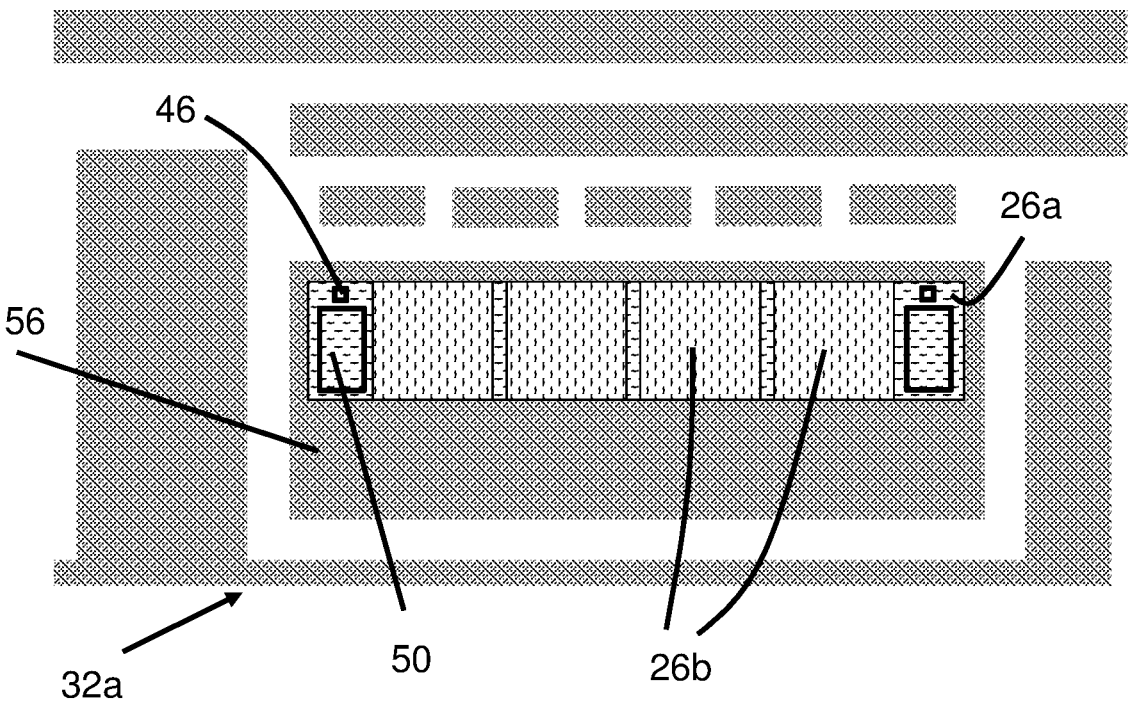
FIGS. 6*a* and 6*b* are respectively a top view and a side view of the first quadrant of the power module of FIG. 1, in which both top chips and bottom chips are shown.
Figure 6B:
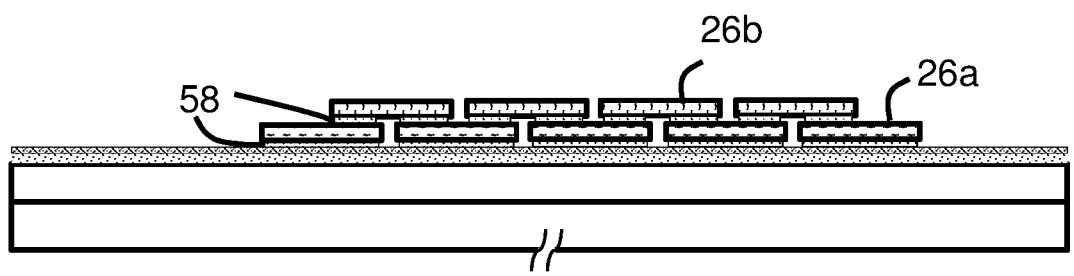

Turning to FIG. 6*a*-6*b*, where the top MOSFET chips 26*b* are shown to be stacked on the top side of the bottom MOSFET chips 26*a*. There are four top MOSFET chips 26*b* in the first quadrant 32*a*, and they are evenly distributed on top of the five bottom MOSFETs 26*a*. In particular, all the bottom MOSFET chips 26*a* and the top MOSFET chips 26*b* are identical, and each top MOSFET chip 26*b* is exactly stacked on two bottom MOSFET chips 26*a*, and that the overlapping area of the top MOSFET chip 26*b* with either of the two bottom MOSFET chips 26*a* is the same. In other words, every top MOSFET chip 26*b* is evenly positioned between the two adjacent bottom MOSFET chip 26*a* in a direction perpendicular to a stacking direction (i.e., the horizontal direction as shown in FIG. 6*b*). The distance between any two adjacent top MOSFET chip 26*b* is also the same as the distance between any two adjacent bottom MOSFET chip 26*a*. It should be noted that the bottom MOSFET chips 26*a* have their source pads 50 and gate pads 46 facing up, while the top MOSFET chips 26*b* are flipped to have their source and gate pads (not shown) facing down. In addition, among the five bottom MOSFET chips 26*a*, three of them are completely covered by the top MOSFET chips 26*b*, but the two bottom MOSFET chips 26*a* at opposite ends of the drain area 56 along its longitudinal direction are not fully covered. Rather each of the two bottom MOSFET chips 26*a* has one gate pad 46 and one source pad 50 exposed, which are configured to make either wire bonding or copper clip bonding to the conducting traces 30. Between the top MOSFET chip 26*b* and the bottom MOSFET chips 26*a*, Ag pastes 58 are configured to allow electrical connection therebetween.

The opposite orientations of the bottom MOSFET chips 26*a* and the top MOSFET chips 26*b* and how they are connected electrically are illustrated with more details in FIGS. 8*a*-8*c*. In particular, as shown in FIGS. 8*b* and 8*c*, the bottom side of the bottom MOSFET chip 26*a* is formed as a drain 64, at which a drain Ag paste 58*a* is applied to secure the bottom MOSFET chip 26*a* to the nickel phosphorus and/or gold plating layers 44 of the first substrate 24*a* (not shown in FIGS. 8*a*-8*c*). The two source pads 50 and the two gate pads 46 are facing up, and as shown in FIG. 8*b* at least one of the source pads 50 is electrically connected by a source Ag paste 58*b* to a corresponding source pad 50 of an adjacent top MOSFET chip 26*b*. Similarly, as shown in FIG. 8*c* at least one of the gate pads 46 is electrically connected by a gate Ag paste 58*c* to a corresponding gate pad 46 of the same, adjacent top MOSFET chip 26*b*. The adjacent top MOSFET chip 26*b* is flipped so it has a reversed pin layout as compared to the bottom MOSFET chip 26*a*, i.e. their identical contact pins (i.e. the gate pad 46, the source pad 50) are located on opposite sides of the two chips that face each other, and the identical contact pins extend in opposite directions. As shown in FIG. 8*a*, alignment is important to ensure the boundaries of source pads 50 and the gate pads 46 of the top MOSFET chips 26*b* to completely overlap to the boundaries of corresponding pads on the bottom MOSFET chips 26*a*.

As the adjacent bottom MOSFET chip 26*a* and top MOSFET chip 26*b* have their gate pads 46 connected, as well as their source pads 50 connected, the adjacent bottom MOSFET chip 26*a* and top MOSFET chip 26*b* are connected in parallel, and so are all nine MOSFET chips 26 in the first quadrant 32*a*. The stacked nine MOSFET chips 26 in the first quadrant 32*a* connect to the conducting traces 30 of the power module by the drain 64 of at the top side of each top MOSFET chip 26*b*, and by the exposed gate pad 46 and source pad 50 at the top side of each of the two end bottom MOSFET chip 26*a*. It should be noted that FIG. 8*c* is a side view where the gate Ag paste 58*c* and a source Ag paste 58*b* seem to be in contact, but in fact they are separated from each other as shown in FIG. 8*a*.

Figure 7A:
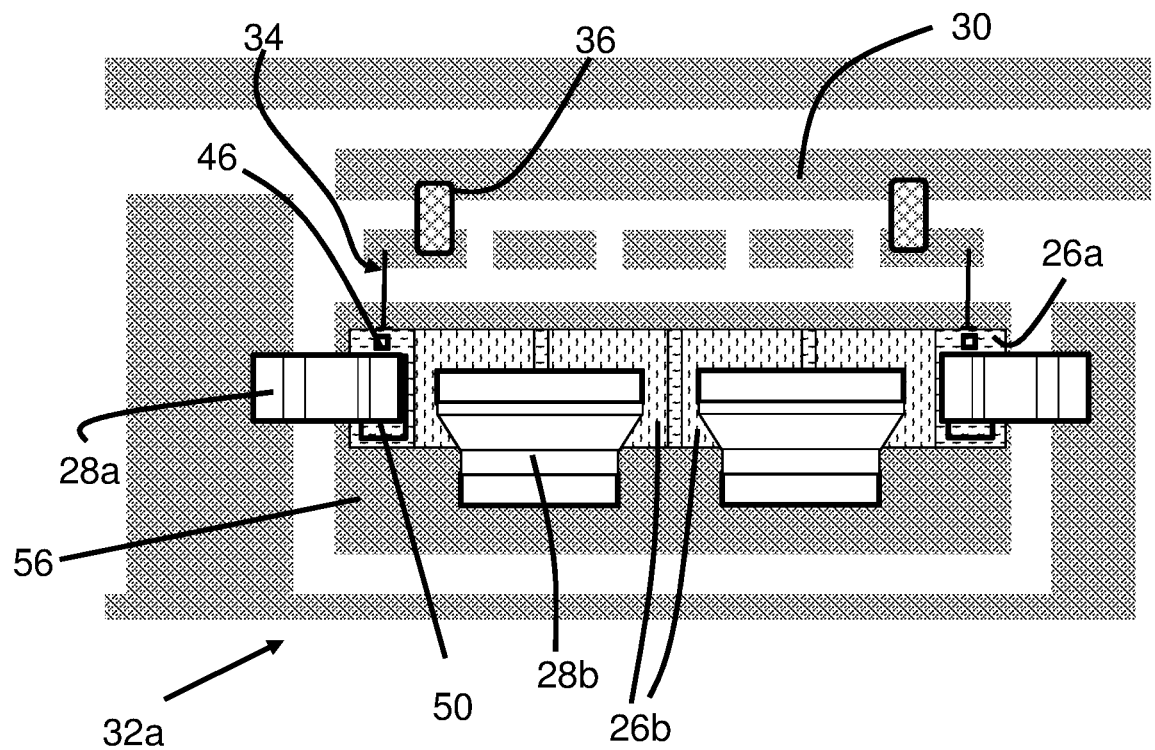
FIGS. 7*a* and 7*b* are respectively a top view and a side view of the first quadrant of the power module of FIG. 1, in which the top chips, the bottom chips, metal clips, wire bonding, and passive components are shown.
Figure 7B:
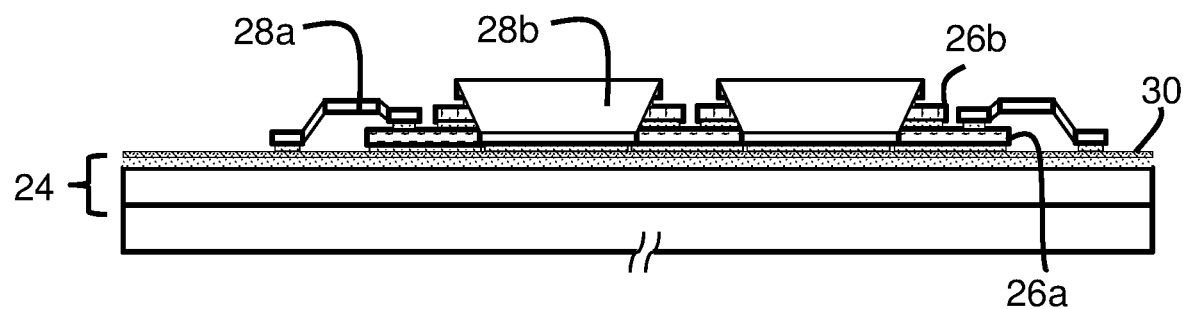
Figure 9A:
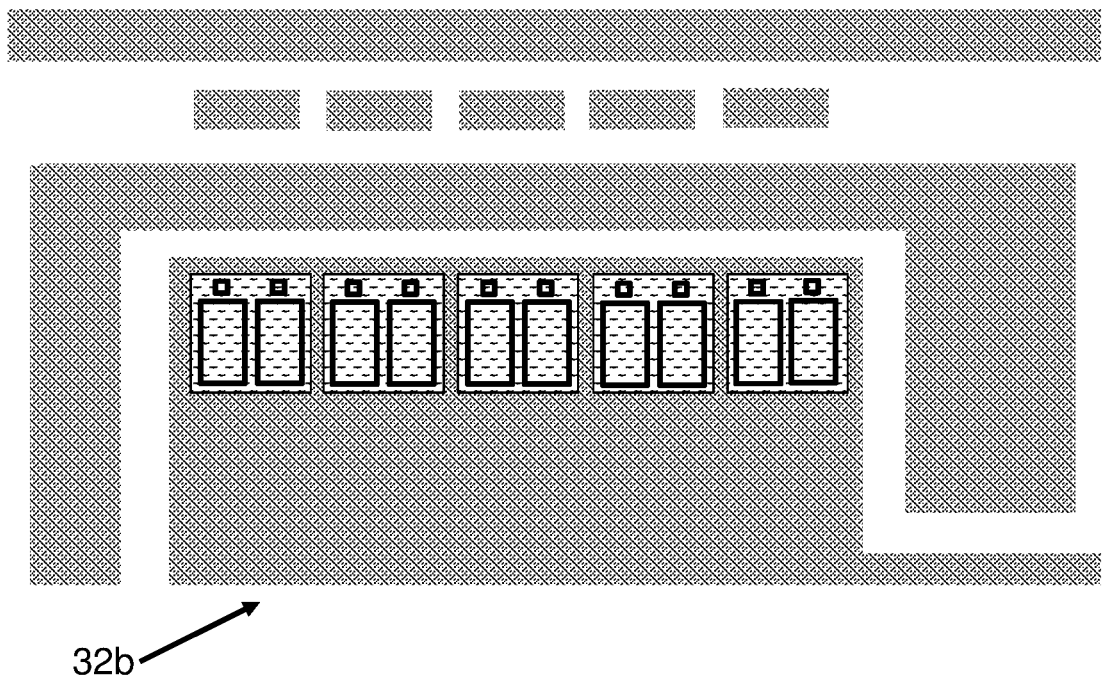
FIGS. 9*a* and 9*b* are respectively a top view and a side view of a second quadrant of the power module of FIG. 1, in which only bottom chips are shown as bonded to the substrate.
Figure 9B:
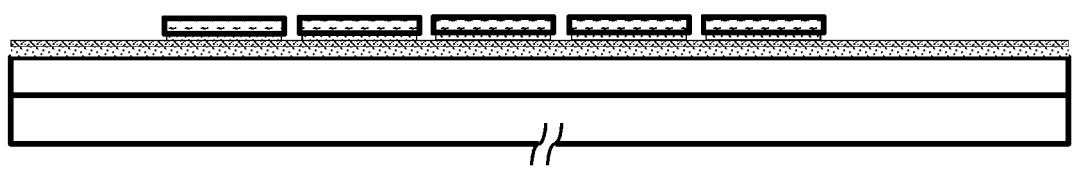
Figure 10A:
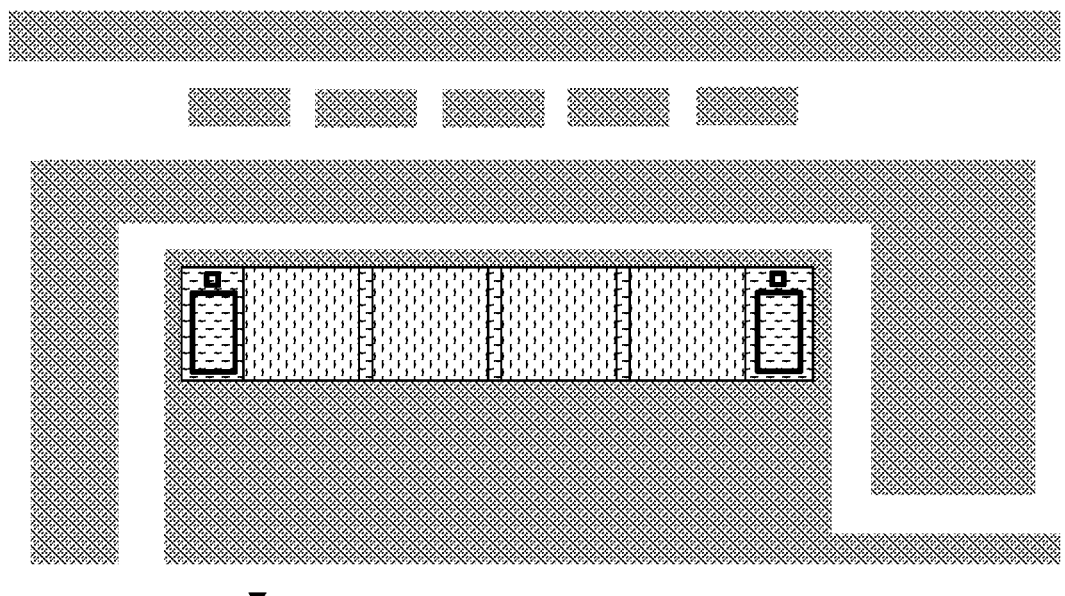
FIGS. 10*a* and 10*b* are respectively a top view and a side view of the second quadrant of the power module of FIG. 1, in which both top chips and bottom chips are shown.
Figure 10B:
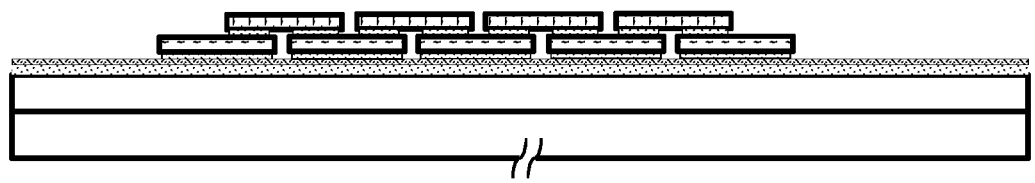
Figure 11A:
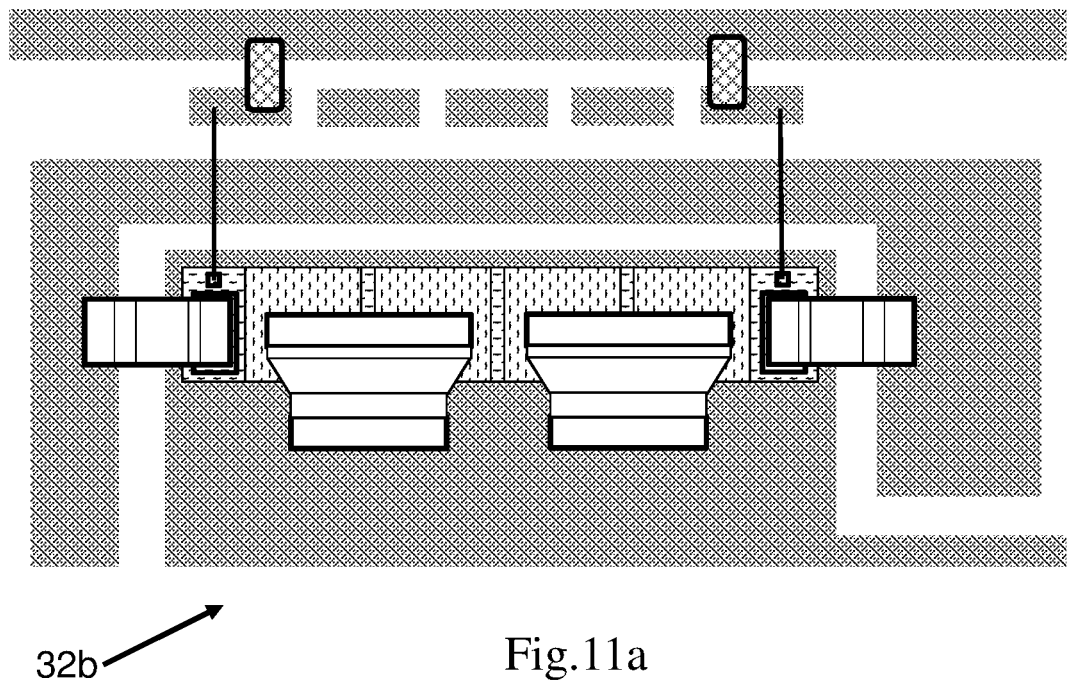
FIGS. 11*a* and 11*b* are respectively a top view and a side view of the second quadrant of the power module of FIG. 1, in which the top chips, the bottom chips, metal clips, wire bonding, and passive components are shown.
Figure 11B:
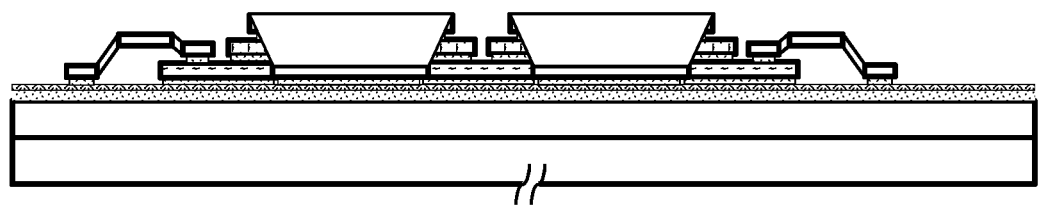
Figure 12A:
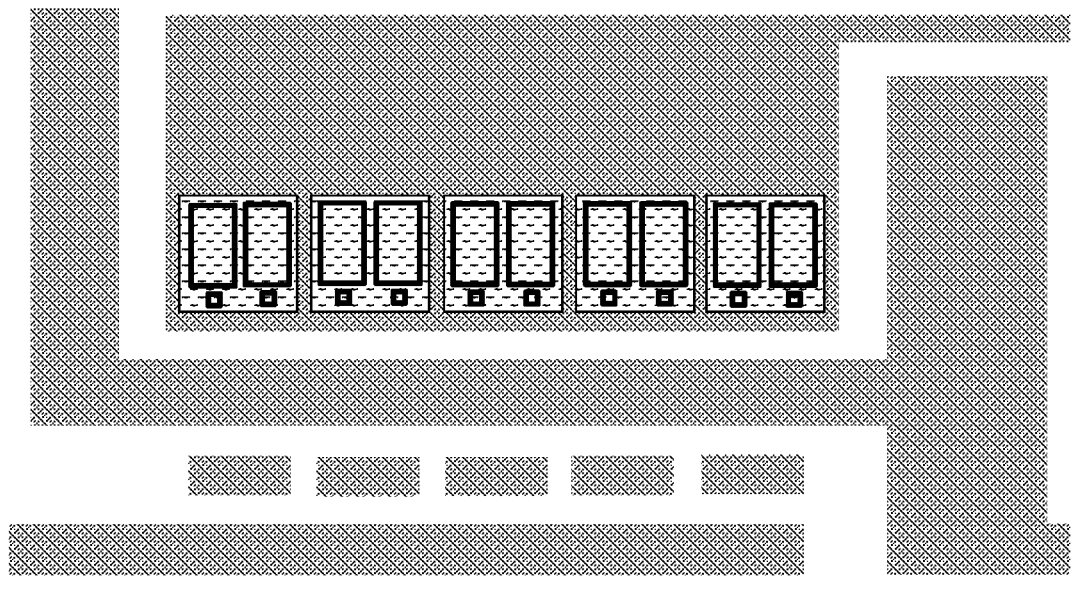
FIGS. 12*a* and 12*b* are respectively a top view and a side view of a third quadrant of the power module of FIG. 1, in which only bottom chips are shown as bonded to the substrate.
Figure 12B:
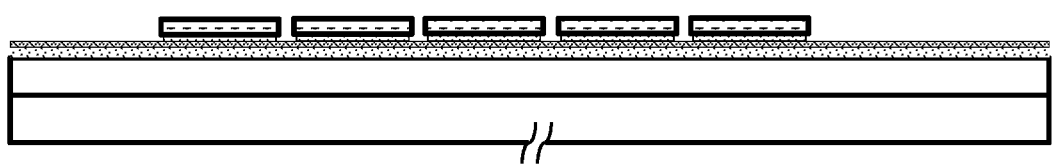
Figure 13A:
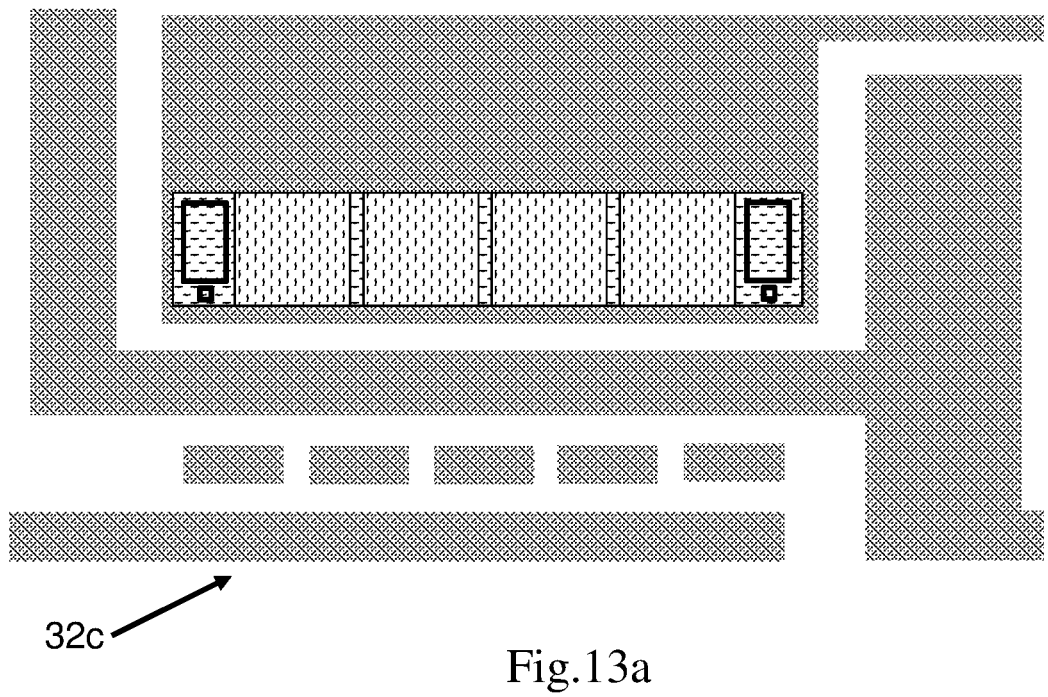
FIGS. 13*a* and 13*b* are respectively a top view and a side view of the third quadrant of the power module of FIG. 1, in which both top chips and bottom chips are shown.
Figure 13B:
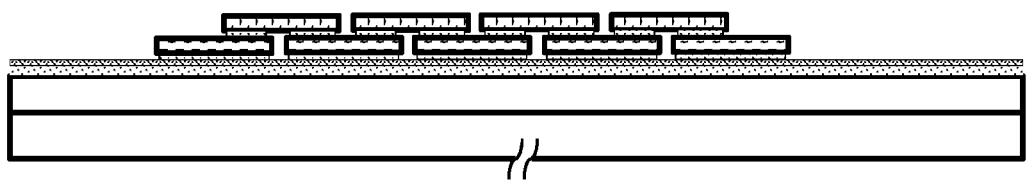
Figure 14A:
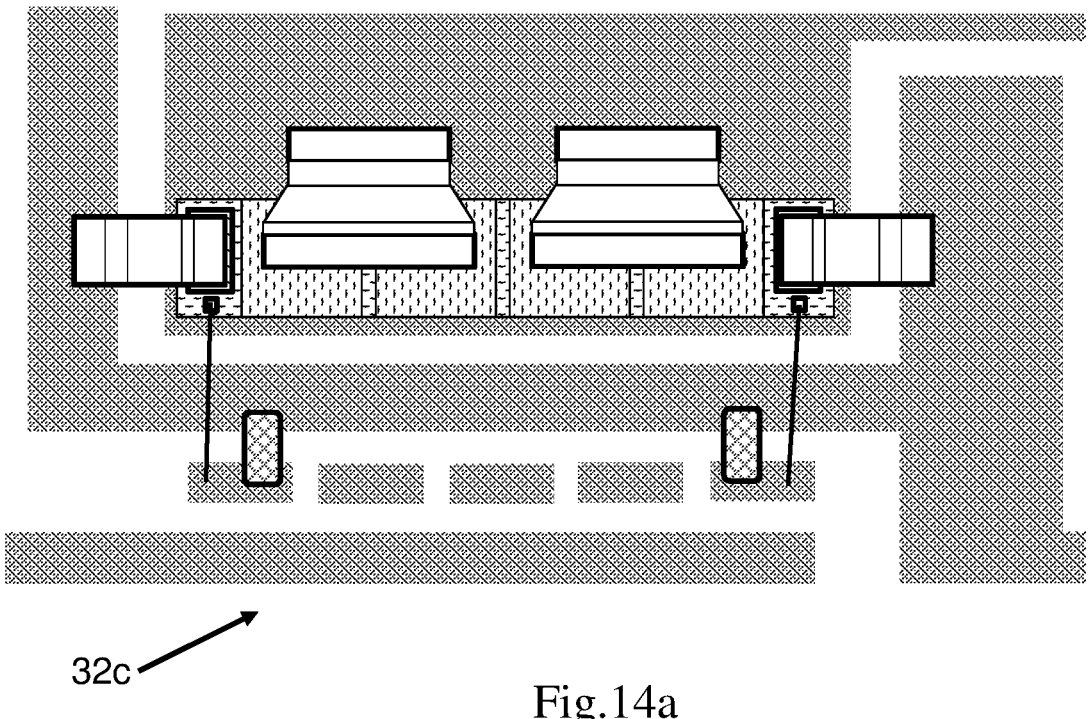
FIGS. 14*a* and 14*b* are respectively a top view and a side view of the third quadrant of the power module of FIG. 1, in which the top chips, the bottom chips, metal clips, wire bonding, and passive components are shown.
Figure 14B:
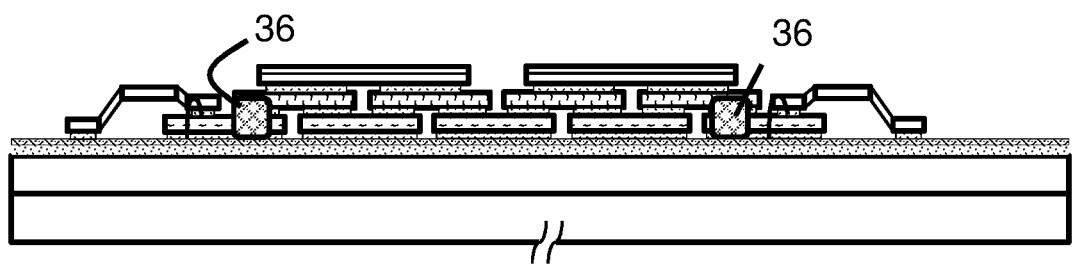
Figure 15A:
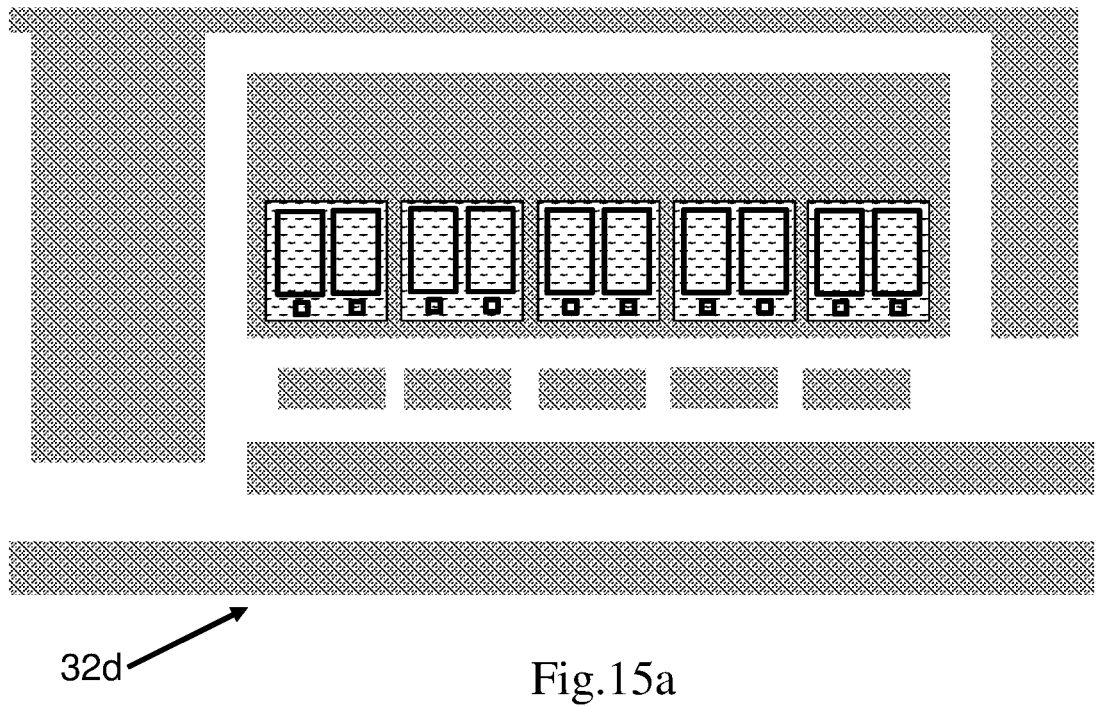
FIGS. 15*a* and 15*b* are respectively a top view and a side view of a fourth quadrant of the power module of FIG. 1, in which only bottom chips are shown as bonded to the substrate.
Figure 15B:
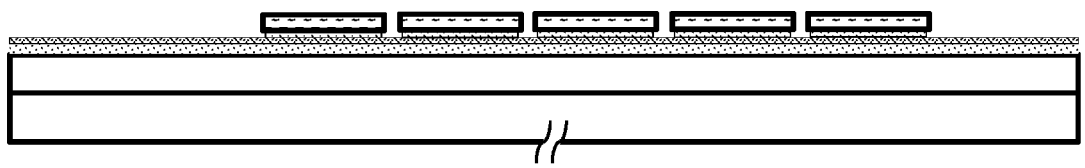

Turning to FIGS. 7*a*-7*b*, the stacked nine MOSFET chips 26 are connected with various bonding wires 34 and copper clips 28 to the conducting traces 30 on the substrate. In particular, the two exposed gate pads 46 at the top side of each of the two bottom MOSFET chip 26*a* at the ends is each connected by a bonding wire 34 to a conducting trace 30 connected with a gate resistor 36. The two exposed source pads 50 at the top side of each of the two end bottom MOSFET chip 26*a* is each connected by a source Cu clip 28*a* to a conducting trace 30. On the other side, the drain 64 at the top side of all the top MOSFET chip 26*b* is connected to the drain area 56 of the conducting trace 30 by two drain Cu clips 28*b*. Each of the drain Cu clips 28*b* connect to two adjacent top MOSFET chip 26*b* at the same time, and thus the drain Cu clip 28*b* is much wider than the source Cu clip 28*a*. The drain Cu clips 28*b* and the source Cu clips 28*a* each contain multiple facets in sequence rather than a smooth, curved surface. As one can see, the Ag pastes 58*a*-58*c* printed on the surface of the MOSFET chips 26, and the Cu clips 28*a*-28*b* bonded to on the surface of the MOSFET chips 26, are required to allow each MOSFET chip 26 to connect as a matrix and stack into multiple layers.

FIGS. 9*a*-17*b* show the three views of each of the second quadrant 32*b*, the third quadrant 32*c*, and the fourth quadrant 32*d*. Despite that horizontal orientations of the MOSFET chips 26 may be different between the quadrants, so are the shapes of conducting traces 30 in each quadrant, the structure of the stacked MOSFET chips 26 in each quadrant is substantially the same as well their wire bonding or Cu clip bonding. Therefore the structures of the second quadrant 32*b*, the third quadrant 32*c*, and the fourth quadrant 32*d* will not be described in details for the sake of brevity. Note that in the side view of the third quadrant 32*c* in FIG. 14*b* shows the gate resistors 36, so is the side view of the fourth quadrant 32*d* in FIG. 17*b*. As a skilled person would understand, the structures of the fourth quadrant 32*d* and the third quadrant 32*c* are mirror images of the first quadrant 32*a* and the second quadrant 32*b* respectively.

Figure 18:
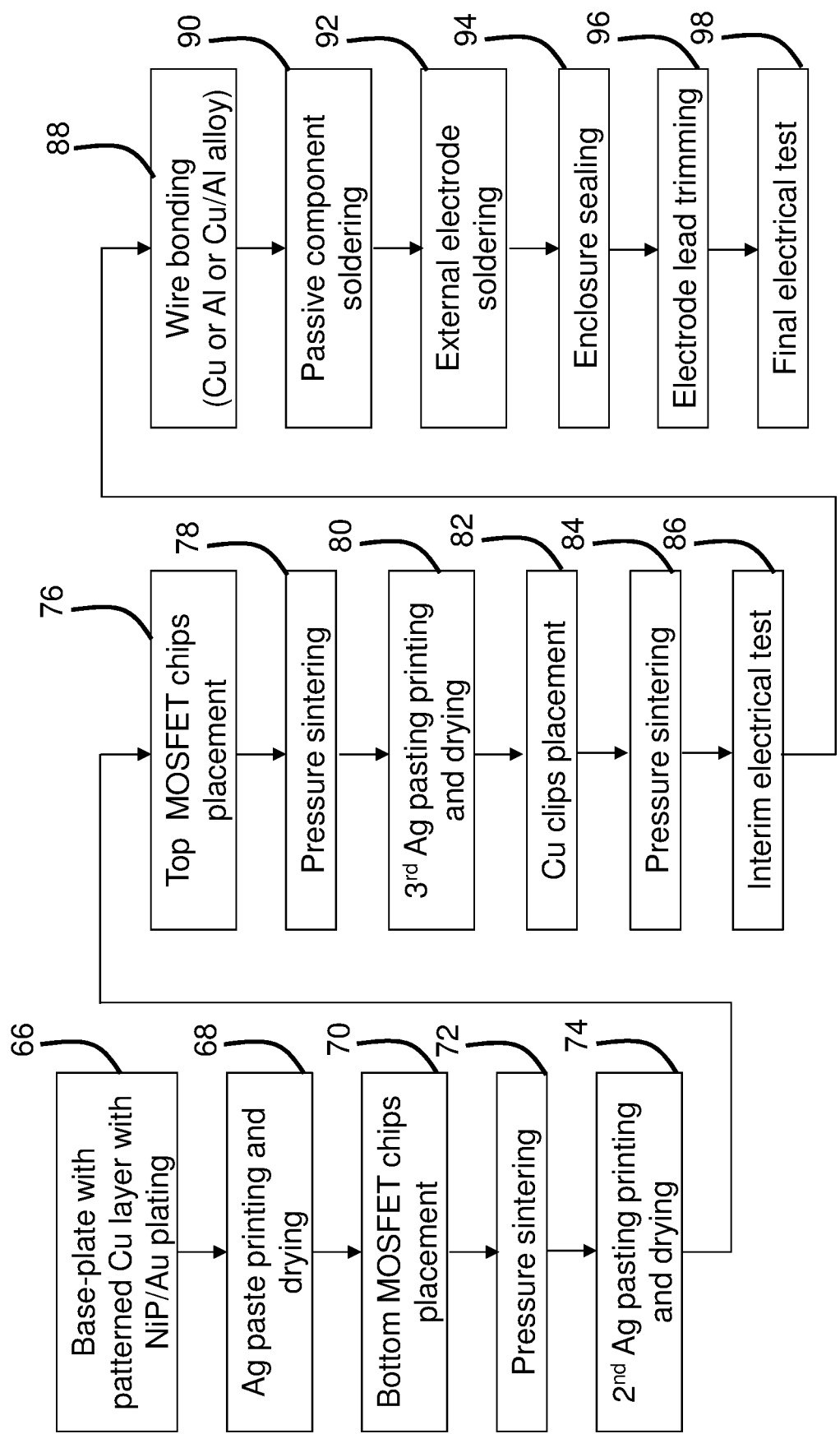
FIG. 18 is a flowchart showing the steps of a method of manufacturing the power module in FIGS. 1-17*b*.

Turning to FIG. 18, which shows the method of manufacturing the power module 18 in FIGS. 2*a*-17*b*. The method starts at Step 66 in which the substrates 24 including the first substrate 24*a* and the second substrate 24*b* are prepared on the base plate 20*b*. This substrates 24 include the patterned conducting traces 30 of the nickel phosphorus and/or gold plating layers 44 and copper layers 42 on top of the ceramic layers 40 as shown in FIG. 3. Then, in Step 68 Ag pastes 58 (and in particular the drain Ag pastes 58*a*) are printed on a surface of the nickel phosphorus and/or gold plating layer 44 and dried, ready for mounting the bottom MOSFET chips 26*a* at their drain 64. In Step 70, the bottom MOSFET chips 26*a* are then placed at their designated locations on the first substrate 24*a* as shown in FIG. 5*a*-5*b*, 9*a*-9*b*, 12*a*-12*b* and 15*a*-15*b* of corresponding quadrants. It should be noted that all twenty (20) bottom MOSFET chips 26*a* in the four quadrants 32*a*-32*d* of the power module 18 are positioned on the first substrate 24*a* in this step. In Step 72, pressure sintering is applied to the drain Ag pastes 58*a* between the first substrate 24*a* and the bottom MOSFET chips 26*a* to secure the latter. By now, the bottom MOSFET chips 26*a* are then finished with their mounting on the first substrate 24a. Next, in Step 74 Ag pastes 58 (and in particular the source Ag pastes 58b and the gate Ag pastes 58c) are printed on the top side of all the bottom MOSFET chips 26a (except for the two exposed gate pads 46 and source pads 50 on the two bottom MOSFET chips 26a at the end, as mentioned above) and dried, so that the bottom MOSFET chips 26a are ready for top MOSFET chips 26b to stack thereon. In Step 76, the top MOSFET chips 26b are then placed at their designated locations on the bottom MOSFET chips 26a as shown in FIGS. 6a-6b, 10a-10b, 13a-13b and 16a-16b of corresponding quadrants. It should be noted that all sixteen (16) top MOSFET chips 26b of the power module 18 are positioned in this step and align to the bottom MOSFET chips 26a as shown in FIG. 8a-8c. In Step 78, pressure sintering is applied to the source Ag pastes 58b and the gate Ag pastes 58c between the top MOSFET chips 26b and the bottom MOSFET chips 26a. By now, the stack structure of the top MOSFET chips 26b and the bottom MOSFET chips 26a are finished. Then, in Step 80 Ag pastes 58 (and in particular the drain Ag pastes 58a) are printed on the top side (which is the drain 64) of all the top MOSFET chips 26b as well as on the two exposed gate pads 46 and source pads 50 at the two bottom MOSFET chips 26a at the ends as mentioned above, and dried so that the various MOSFET chips 26 are ready for connecting the bonding wires 34 and the Cu clips 28. In Step 82, the two exposed source pads 50 at the top side of each of the two end bottom MOSFET chip 26a are each connected by a source Cu clip 28a to a conducting trace 30, and the drain 64 of the four top MOSFET chip 26b are connected to the conducting traces 30 by two drain Cu clips 28b. Pressure sintering is then applied in Step 84 to the drain Ag pastes 58a and source pastes 58b so as to fix the Cu clips 28. Then in Step 86 an interim electrical test is conducted for power module 18 as its major components (i.e. the MOSFET chips 26) have been assembled. This step will ensure these major components are not been damaged during the manufacturing process before we move forward. Then, in Step 88 the two exposed gate pads 46 at the top side of each of the two end bottom MOSFET chip 26a is each connected by a bonding wire 34 to a conducting trace 30 which is in turn connected with the gate resistor 36 in Step 90 by soldering the gate resistor 36. In Step 88, the first substrate 24a is also electrically connected to the second substrate 24b with the bonding wires 34 as mentioned previously. By now the power module 18 would have the structure as shown in FIGS. 7a-7b, 11a-11b, 14a-14b and 17a-17b of corresponding quadrants. Next, external electrodes (not shown) that electrically connect the substrates 24 are soldered, which become the seven electric terminals mentioned above. In Step 94, the cover 20a of the housing 20 is sealed to the base 20b when the substrates 24 is placed therebetween, with the seven electric terminals positioned to respective openings (not shown) on the cover 20a. In Step 96, the free ends of the external electrodes are trimmed so that they meet the manufacturing requirement of the power module 18 (e.g. the free ends do not extend out of the housing 20a). Lastly, in Step 98 a final electrical test is conducted on the power module 18 and if the final electrical test is passed, then the power module 18 becomes ready for packaging and shipment.

Figure 19:
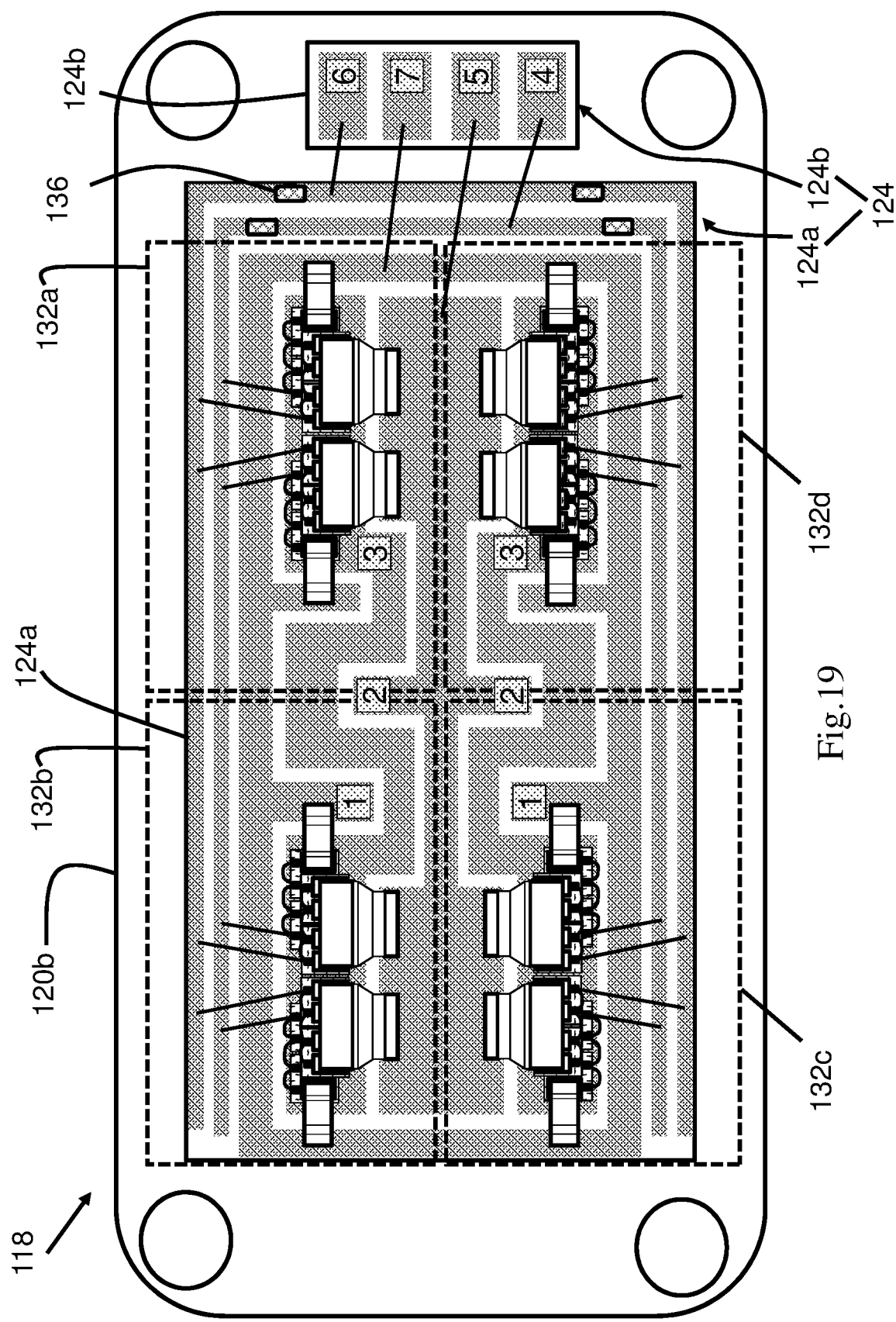
FIG. 19 is the interior layout view of MOSFET chips and the substrate in the power module according to a second embodiment of the invention.
Figure 20:
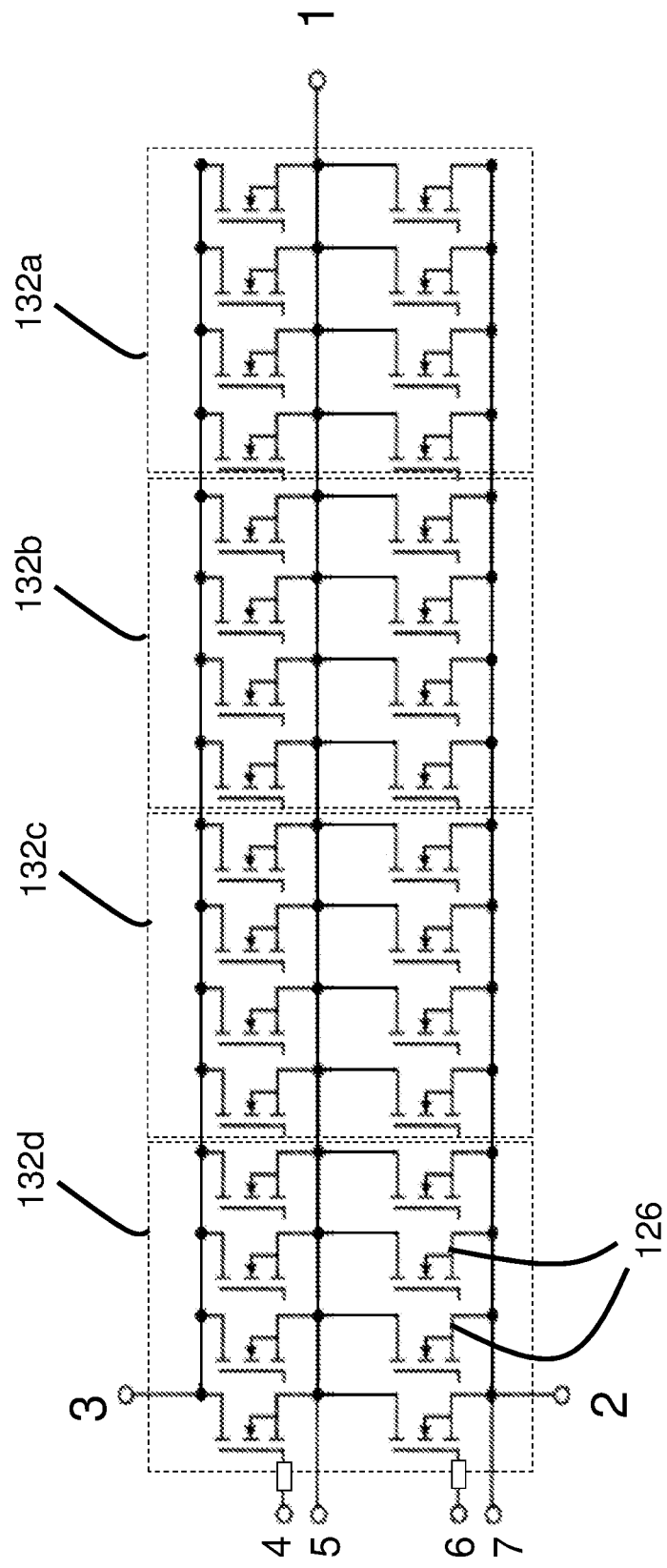
FIG. 20 shows the equivalent circuit of the power module of FIG. 19.

Turning to FIG. 19, which shows the internal structure of a power module 118 according to another embodiment of the invention. For the sake of brevity, only the differences between the power module 118 and the power module illustrated in FIGS. 2a-17b will be described herein. One should note that the power module 118 could have the same or different outside appearance (e.g. that of the cover of the housing) as that shown in FIG. 1. The power module 118 has two substrates 124 including a first substrate 124a and a second substrate 124b located in a base plate 120b of the housing of the power module 118. The first substrate 124a on its top side can also be divided into four quadrants 132a-132d, each receiving a sub-module. Compared to the embodiment shown in FIG. 2a-17b, the most significant difference is that the power module 118 uses a series chip stacking option for the MOSFET chips 126 when they are stacked but each MOSFET chip 126 is identical (and it also could be different) with that in the embodiment shown in FIGS. 2a-17b. As shown in the equivalent circuit in FIG. 20 the sub-modules in the four quadrants 132a-132d are connected with each other in parallel, and inside each sub-module there are two groups of MOSFET chips 126. The two groups are connected in series with each other, but within each group the four MOSFET chips 126 are connected in parallel. As such, each quadrant 132a-132d serves the purpose of providing both high side and low side switching devices. Each quadrant 132a-132d contains eight MOSFET chips 126, and the even number of chips is required to prevent imbalance between high side and low side.

Figure 21A:
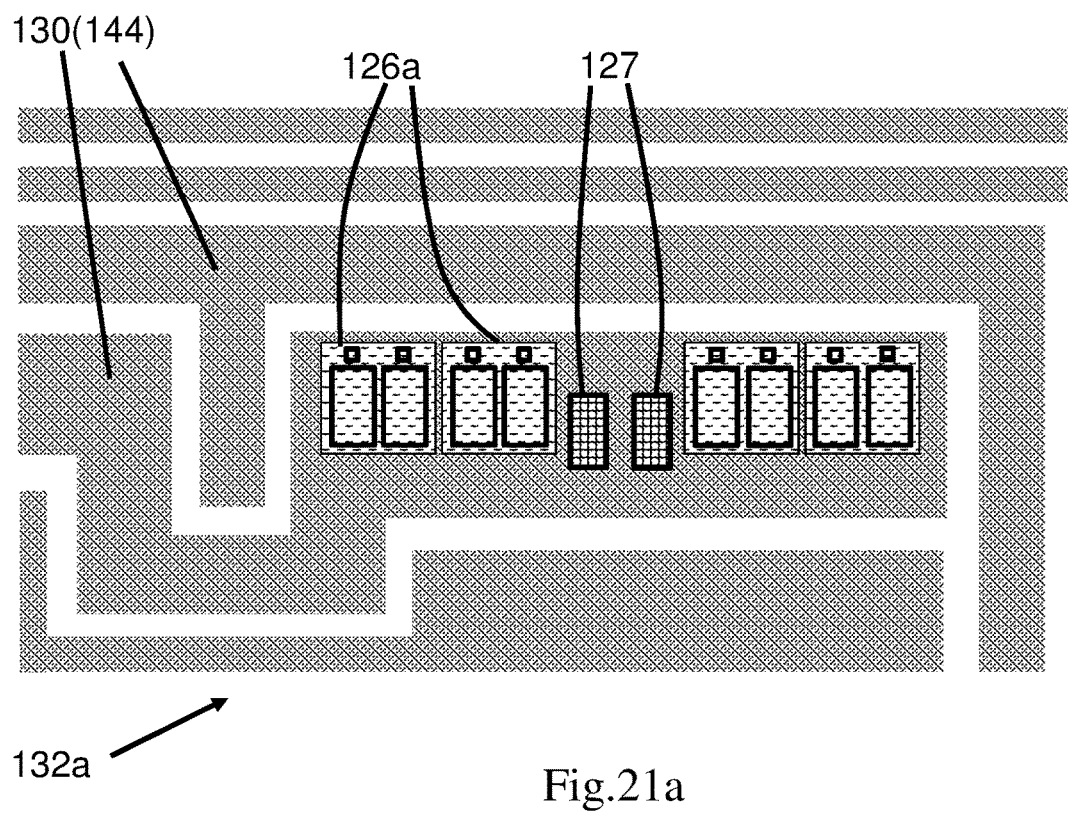
FIGS. 21*a* and 21*b* are respectively a top view and a side view of a first quadrant of the power module of FIG. 19, in which only bottom chips are shown as bonded to the substrate.
Figure 21B:
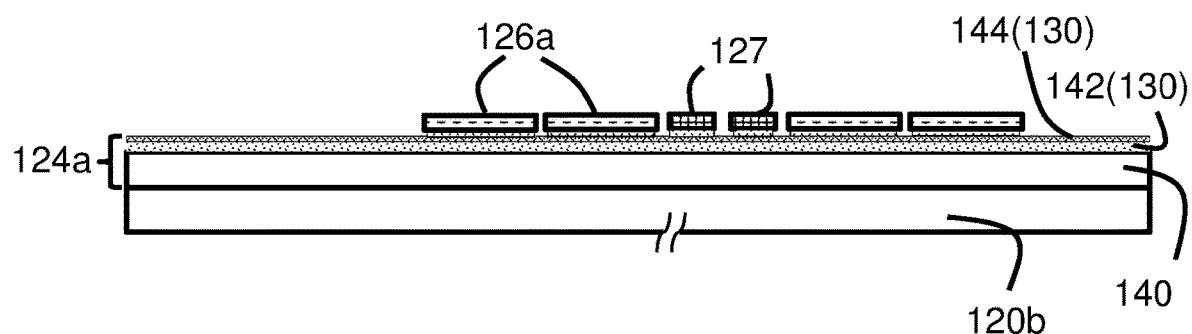

Turning to FIGS. 21a and 21b, in the first quadrant 132a there are four bottom MOSFET chips 126a installed on top of the substrate 124a and in particular on nickel phosphorus and/or gold plating layers 144 on the substrate 124a. Unlike the embodiment in FIGS. 2a-17b, there is no fifth bottom MOSFET chip at the center, but instead two spacers 127 are located at the center location with two bottom MOSFET chips 126a located on one side of the two spacers 127 and two bottom MOSFET chips 126a located on another side of the two spacers 127. The spacers are made of ceramic materials known as Aluminum Oxide (Al2O3), Aluminum Nitride (AlN) or Silicon Nitride (Si3N4), which show characteristics of high thermal conductivity but electronically non-conducting. The spacers 127 are used to partially support a top MOSFET chip (not shown in FIGS. 21a and 21b), and to serve as heat spreader to dissipate the heat from MOSFET chips 126 to the first substrate 124a. The spacers 127 have the same thickness as the MOSFET chip 126 (which is 200 μm in this embodiment).

Figure 22A:
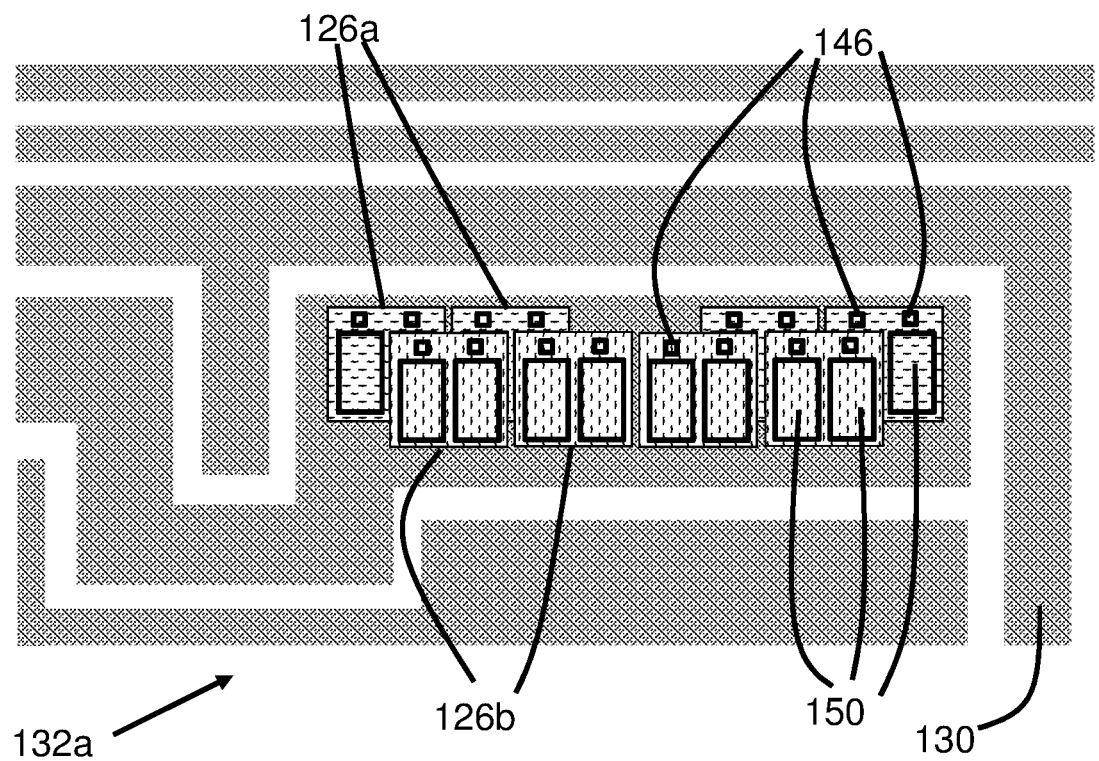
FIGS. 22*a* and 22*b* are respectively a top view and a side view of the first quadrant of the power module of FIG. 19, in which both top chips and bottom chips are shown.
Figure 22B:
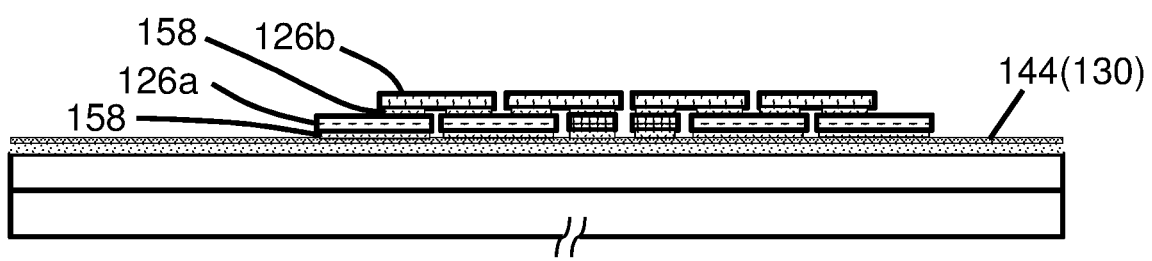

Turning to FIGS. 22a-22b, in which the top MOSFET chips 126b as they are stacked on the bottom MOSFET chips 126a and the spacers 127 are shown. In this embodiment, there are eight MOSFET chips 126 in each quadrant, including four top MOSFET chips 126b and four bottom MOSFET chips 126a. As shown in FIG. 22a, the bottom MOSFET chips 126a have their source pads 150 and gate pads 146 facing up, while the top MOSFET chips 126b sitting on two adjacent bottom MOSFET chips 126a have their source pads 150 and gate pads 146 facing up as well. In other words, in this embodiment all the MOSFET chips 126 have the same pin layout, and the corresponding pins of all the MOSFET chips 126 face a same direction. The drain (not shown) of the bottom MOSFET chips 126a are physically and electrically bonded to the nickel phosphorus and/or gold plating layers 144 by Ag pastes 158. In addition, the source pads 150 on all the bottom MOSFET chips 126a are connected to their respective drain (not shown in FIGS. 22a-22b) of a top MOSFET chip 126b by Ag pastes 158, except for a source pad 150 on the two outermost bottom MOSFET chips 126a and a gate pad 146 on the four bottom MOSFET chips 126a that are not covered fully by the top MOSFET chip 126b.

The four top MOSFET chips 126b are separated from each other at a same distance, and they are aligned along a line parallel to the placement of the four bottom MOSFET chips 126a. There is an offset between top MOSFET chips 126b and bottom MOSFET chips 126a so that the gate pad 146 on the four bottom MOSFET chips 126a can be exposed. The two outer top MOSFET chips 126b are evenly supported by the source pads 150 of two bottom MOSFETs 126a, and that the overlapping area of the top MOSFET chip 126b with the two bottom MOSFET chips 126a is the same. In other words, the two outer top MOSFET chip 126b is evenly positioned between the two adjacent bottom MOSFET chips 126a in a direction perpendicular to a stacking direction. However, for each of the two inner top MOSFET chips 126b it is stacked on one bottom MOSFET chip 126a, and also on a corresponding spacer 127. Each of the two outermost bottom MOSFET chips 126a has one source pad 150 exposed, which are used to make copper clip bonding to the conducting traces 130.

Figure 24:
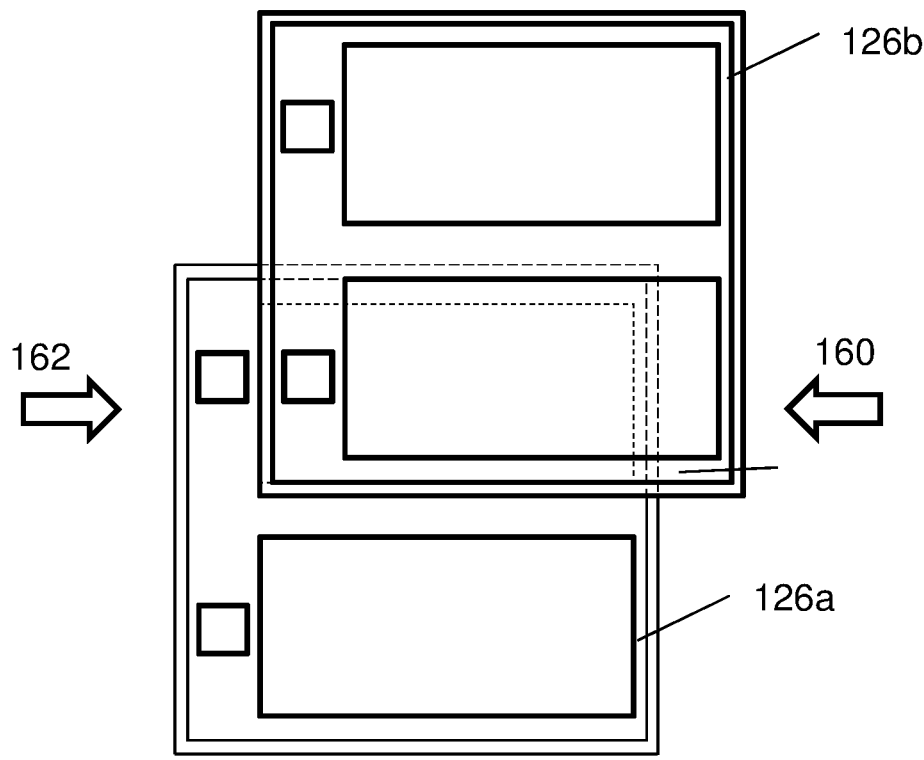
FIG. 24 is a top view of a part of the chip stacking structure in the first quadrant of FIGS. 21*a*-23*b*.
Figure 25A:
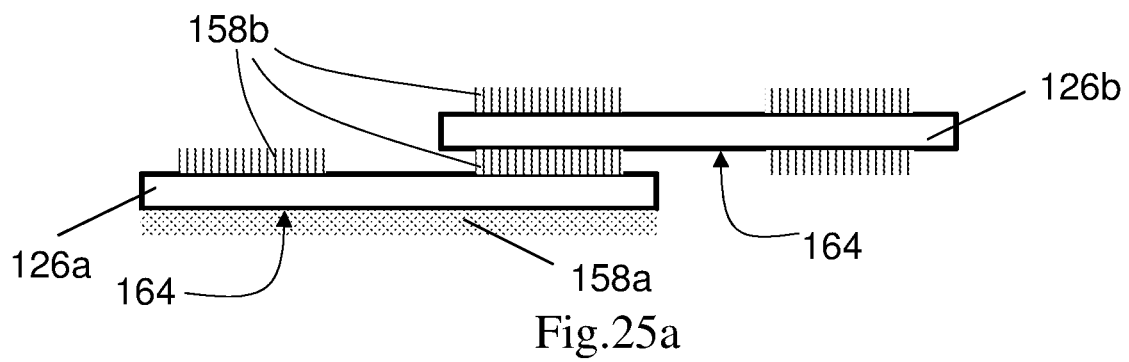
FIG. 25*a* is a side view of the chip stacking structure in FIG. 24 along the direction shown by the arrow 160 (where a spacer is not displayed).
Figure 25B:
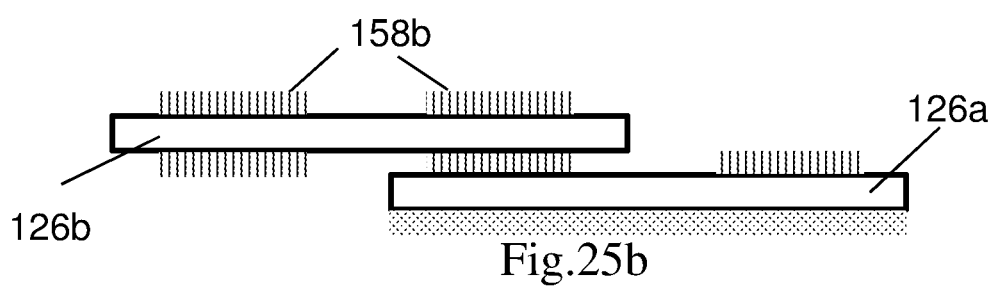
FIG. 25b is a side view of the chip stacking structure in FIG. 24 along the direction shown by the arrow 162 (where a spacer is not displayed).
Figure 26A:
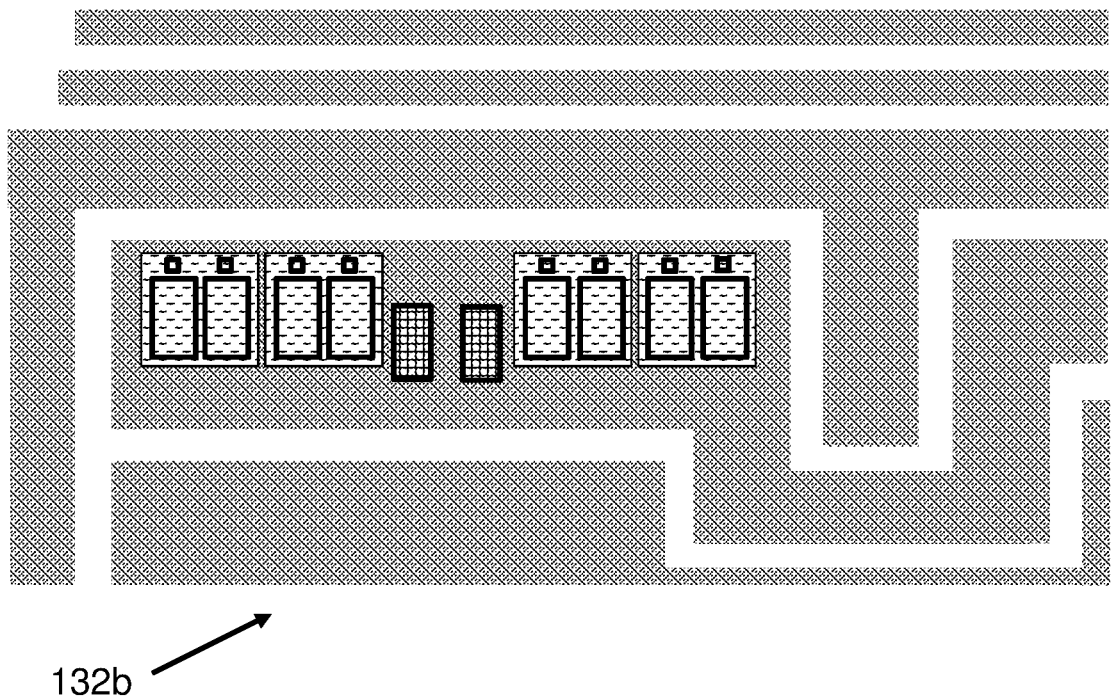
FIGS. 26a and 26b are respectively a top view and a side view of a second quadrant of the power module of FIG. 19, in which only bottom chips are shown as bonded to the substrate.
Figure 26B:
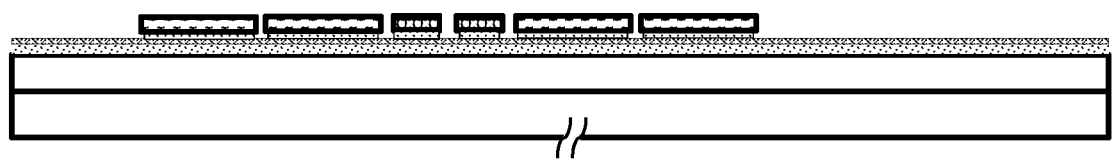
Figure 27A:
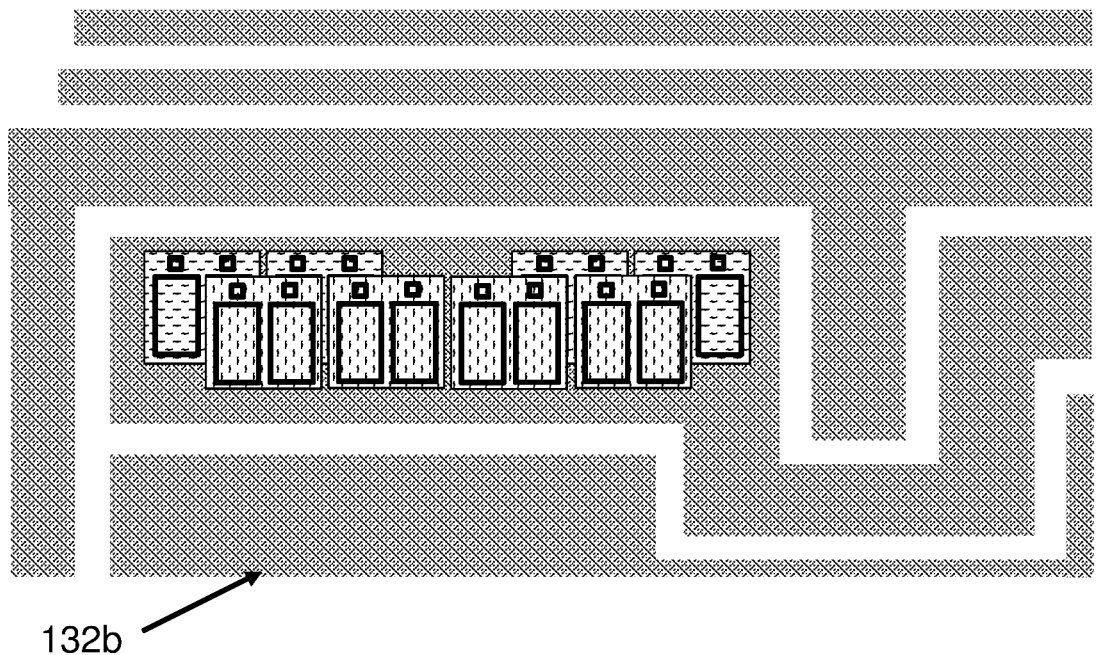
FIGS. 27a and 27b are respectively a top view and a side view of the second quadrant of the power module of FIG. 19, in which both top chips and bottom chips are shown.
Figure 27B:
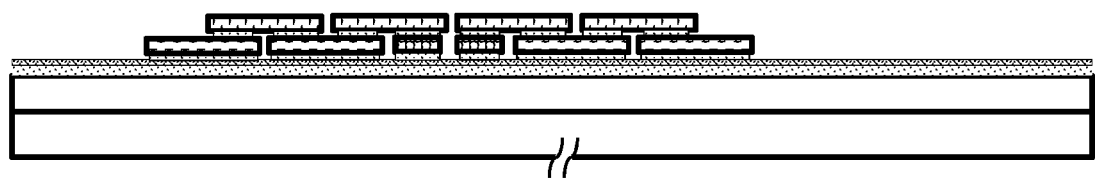
Figure 28A:
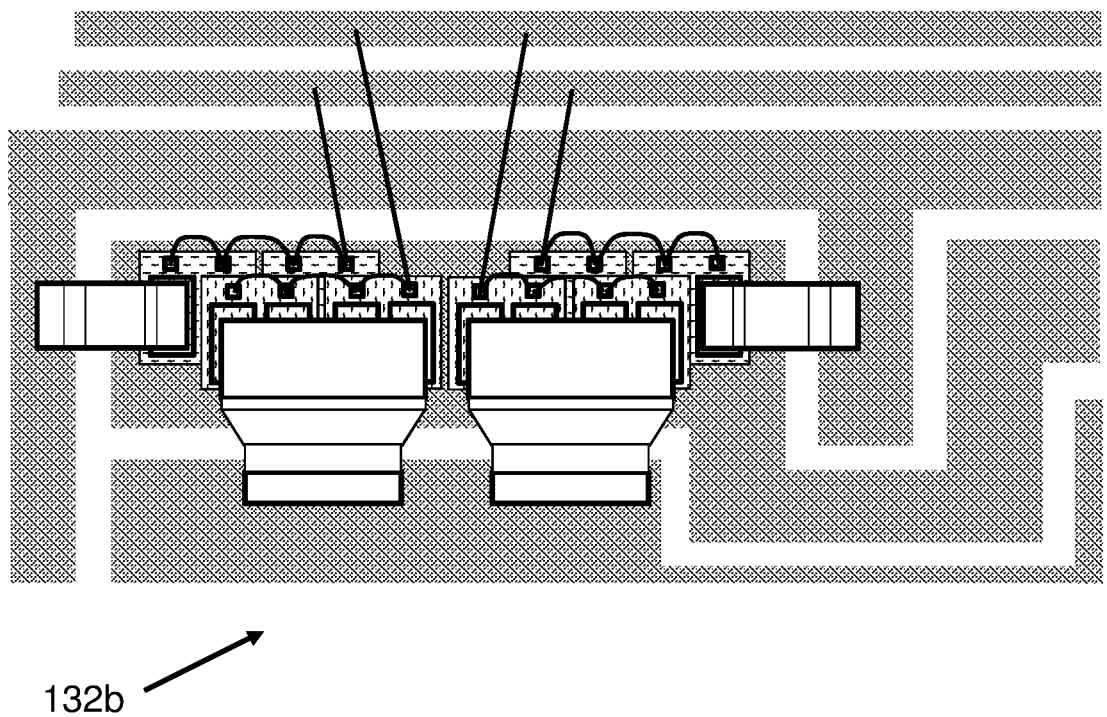
FIGS. 28a and 28b are respectively a top view and a side view of the second quadrant of the power module of FIG. 19, in which the top chips, the bottom chips, metal clips, wire bonding and passive components are shown.
Figure 28B:
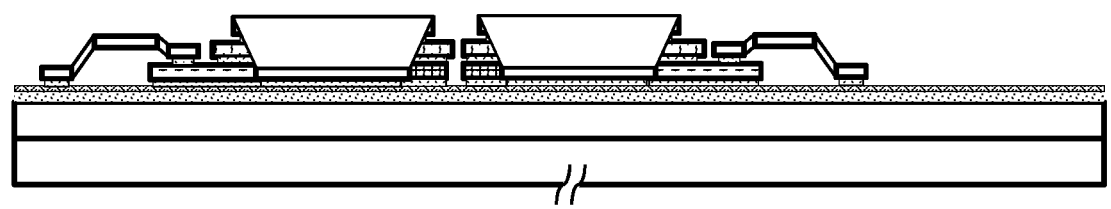
Figure 29A:
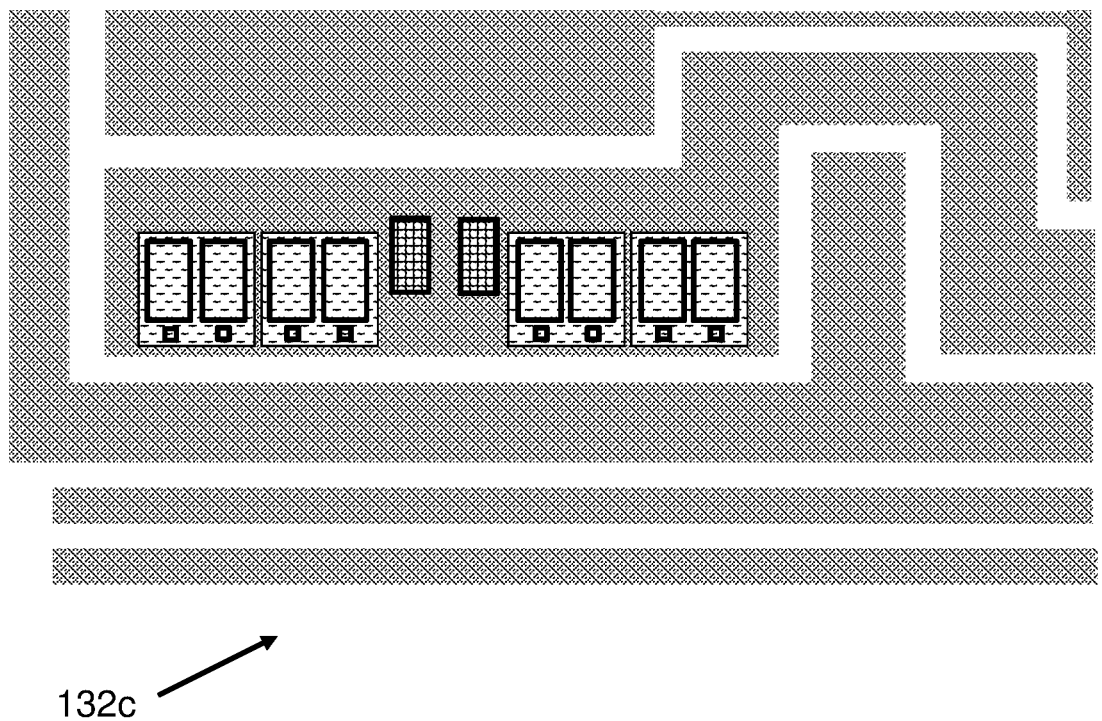
FIGS. 29a and 29b are respectively a top view and a side view of a third quadrant of the power module of FIG. 19, in which only bottom chips are shown as bonded to the substrate.
Figure 29B:
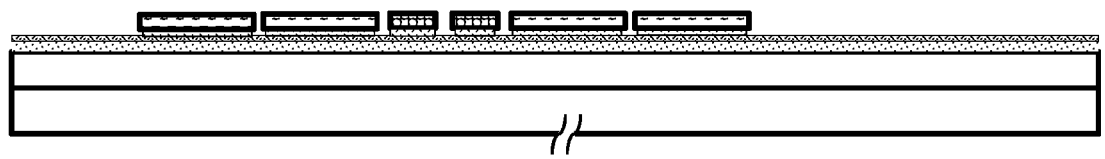
Figure 30A:
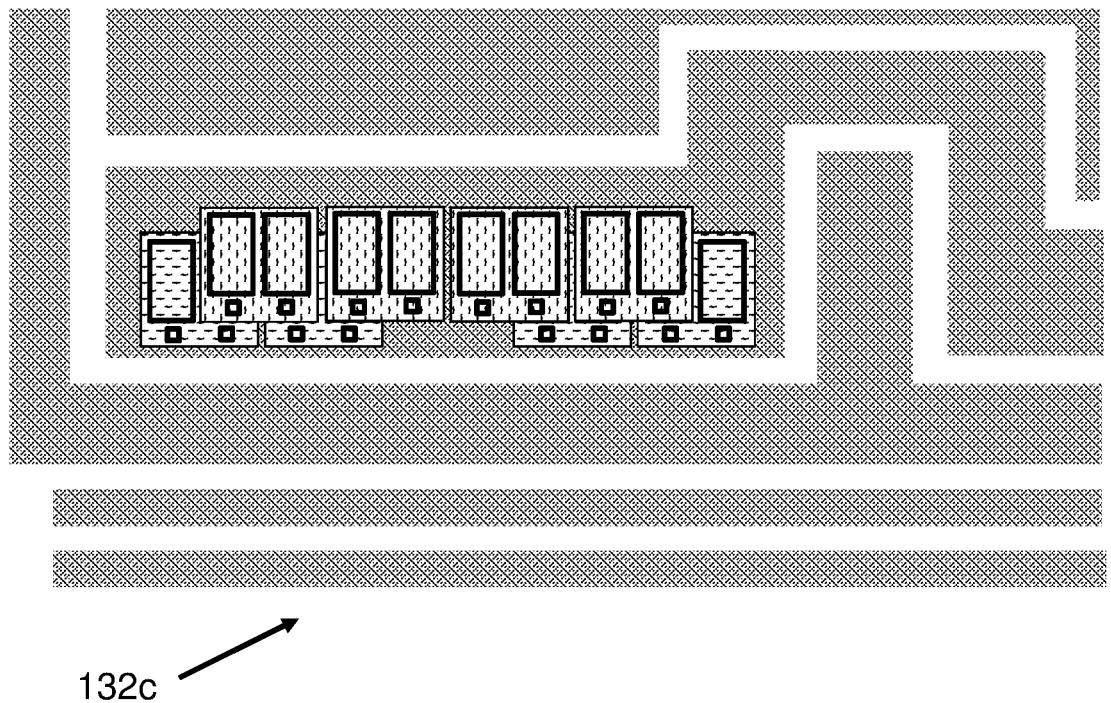
FIGS. 30a and 30b are respectively a top view and a side view of the third quadrant of the power module of FIG. 19, in which both top chips and bottom chips are shown.
Figure 30B:
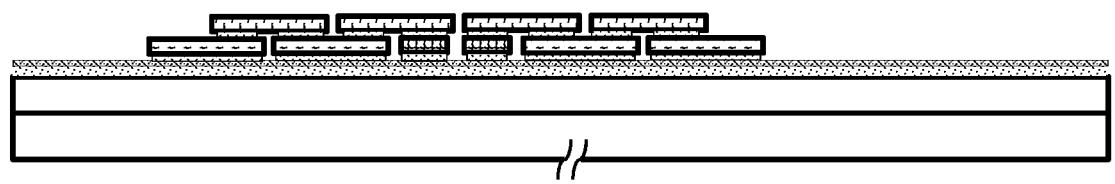
Figure 31A:
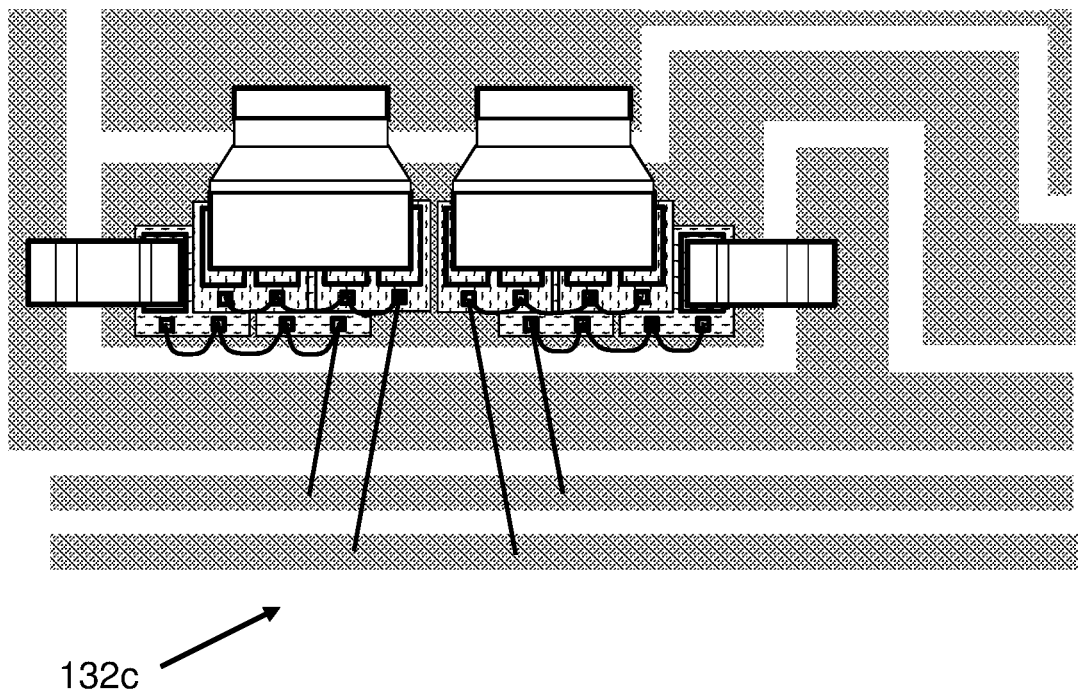
FIGS. 31a and 31b are respectively a top view and a side view of the third quadrant of the power module of FIG. 19, in which the top chips, the bottom chips, metal clips, wire bonding and passive components are shown.
Figure 31B:
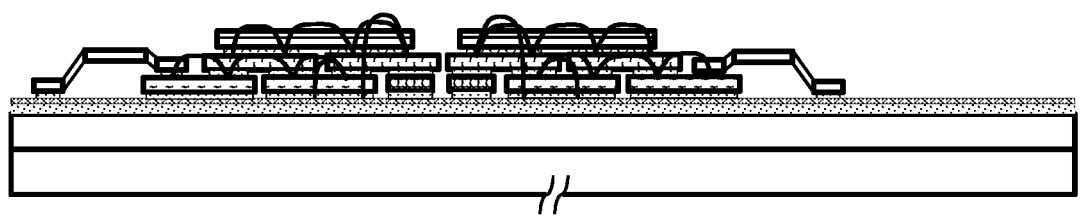
Figure 32A:
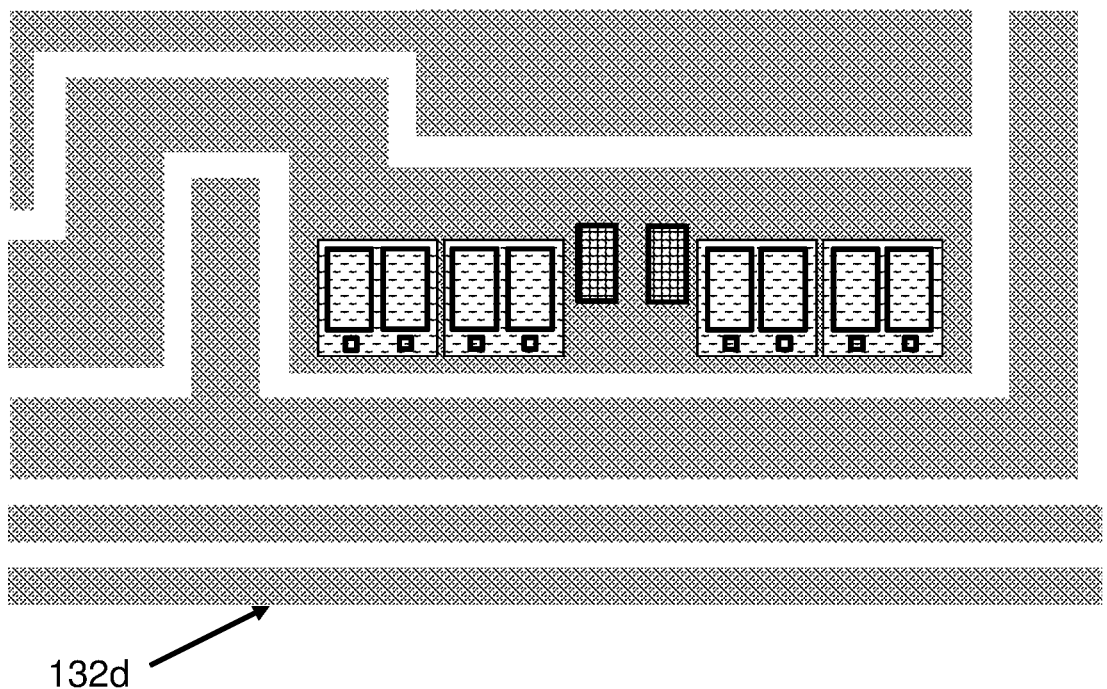
FIGS. 32a and 32b are respectively a top view and a side view of a fourth quadrant of the power module of FIG. 19, in which only bottom chips are shown as bonded to the substrate.
Figure 32B:
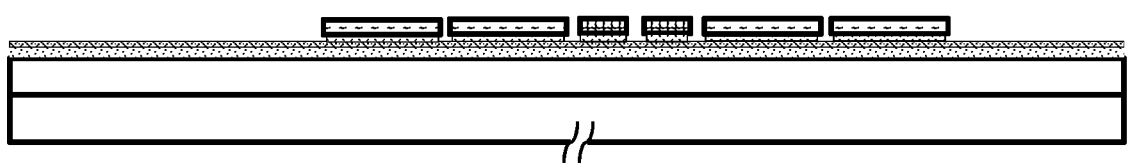
Figure 33A:
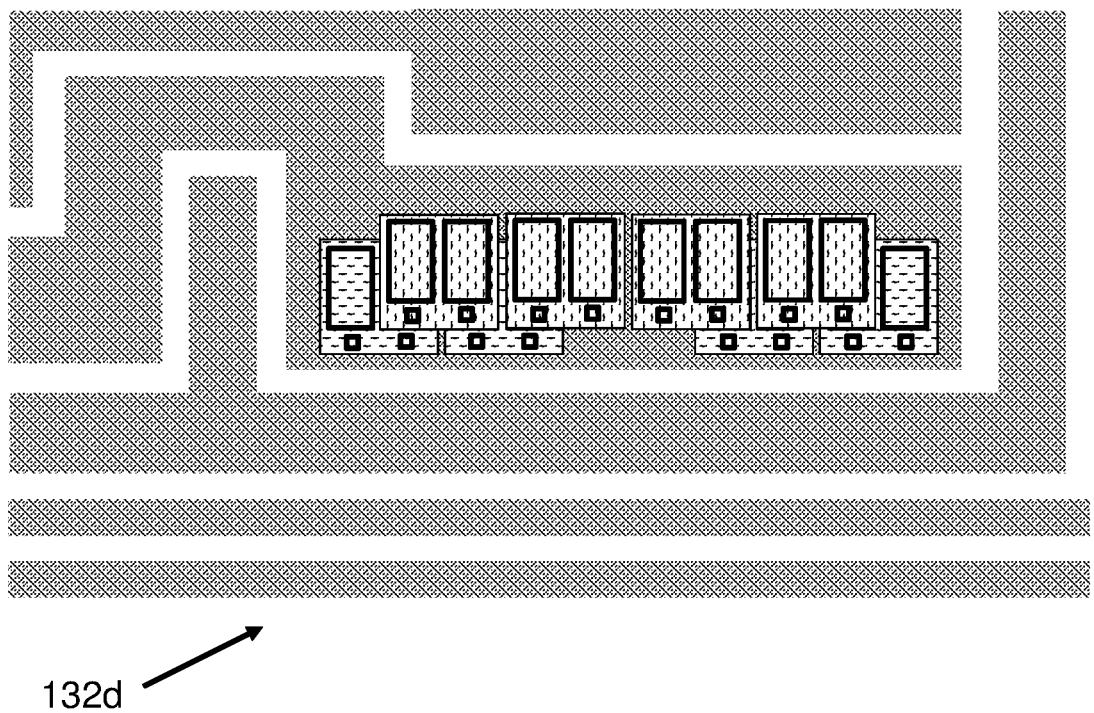
FIGS. 33a and 33b are respectively a top view and a side view of the fourth quadrant of the power module of FIG. 19, in which both top chips and bottom chips are shown.
Figure 33B:
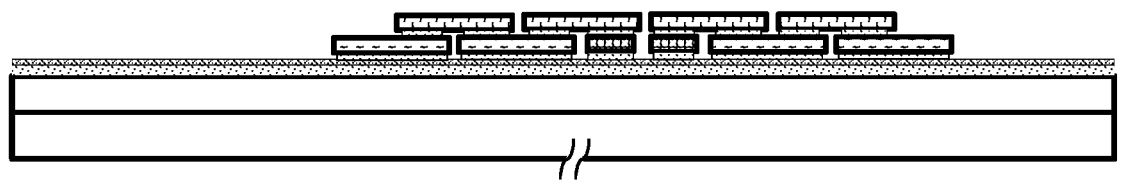
Figure 34A:
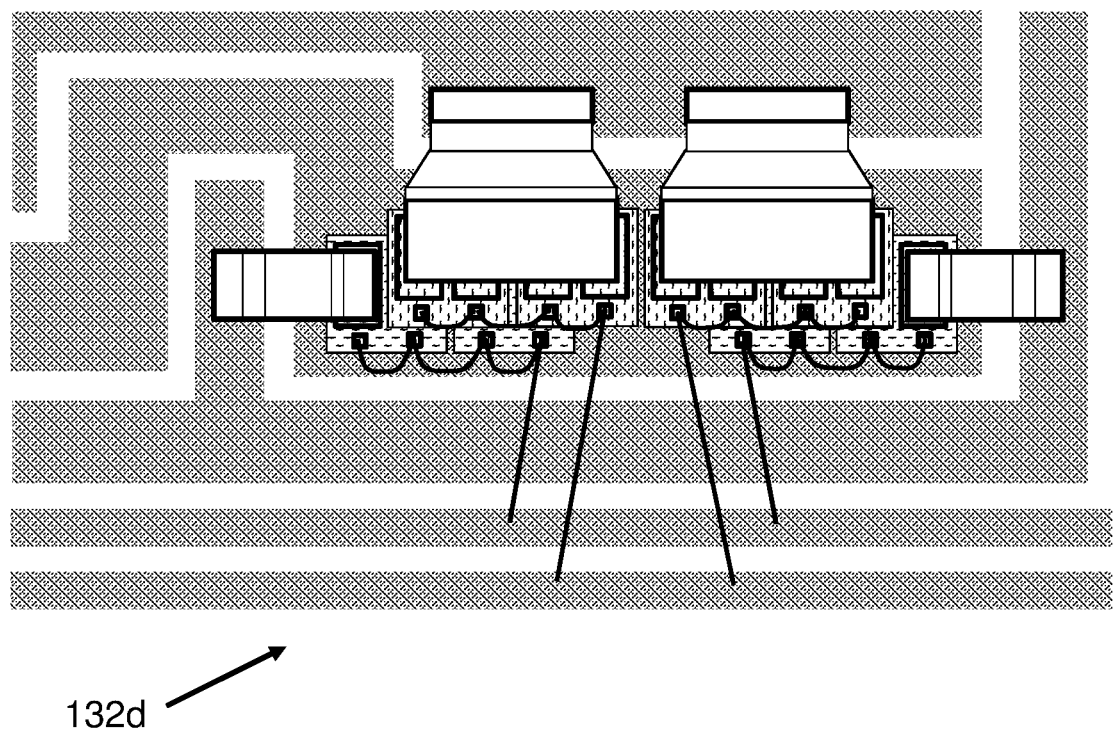
FIGS. 34a and 34b are respectively a top view and a side view of the fourth quadrant of the power module of FIG. 19, in which the top chips, the bottom chips, metal clips, wire bonding and passive components are shown.
Figure 34B:
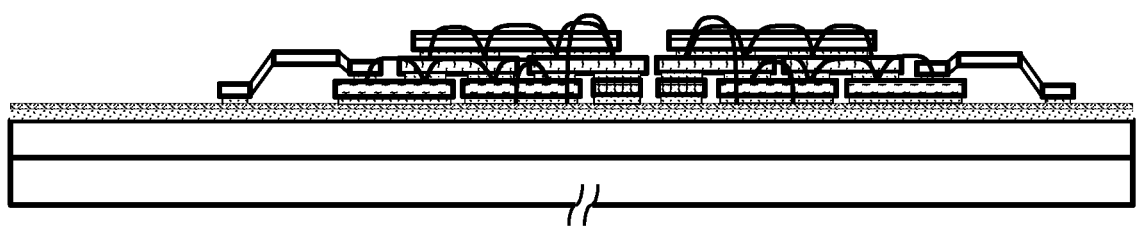

The identical orientations of the bottom MOSFET chips 126a and the top MOSFET chips 126b and how they are connected electrically are illustrated with more details in FIGS. 24-25b. In particular, as shown in FIGS. 25a and 25b, the bottom side of the bottom MOSFET chip 126a is formed as a drain 164, at which a drain Ag paste 158a is applied to secure the bottom MOSFET chip 126a to the nickel phosphorus and/or gold plating layers 144 of the substrate (not shown in FIGS. 24-25b). The two source pads 150 and the two gate pads 146 are facing up, and as shown in FIG. 25a at least one of the source pads 150 of the bottom MOSFET chip 126a is electrically connected by a drain Ag paste 158a to a corresponding drain 164 of an adjacent top MOSFET chip 126b. It should be noted that the gate pads 146 of the bottom MOSFET chip 126a are not connected to those of the top MOSFET chip 126b as shown in FIG. 24.

As the source of a bottom MOSFET chip 126a is connected to the drain of an adjacent top MOSFET chip 126b, the adjacent bottom MOSFET chip 126a and top MOSFET chip 126b are connected in series. However, as will be explained below the four bottom MOSFET chip 126a are connected in parallel with each other, and the four top MOSFET chip 126b are connected in parallel with each other as well. It should be noted that FIG. 25a is a side view from direction 160 and FIG. 25b is a side view from direction 162 as shown in FIG. 24.

Figure 23A:
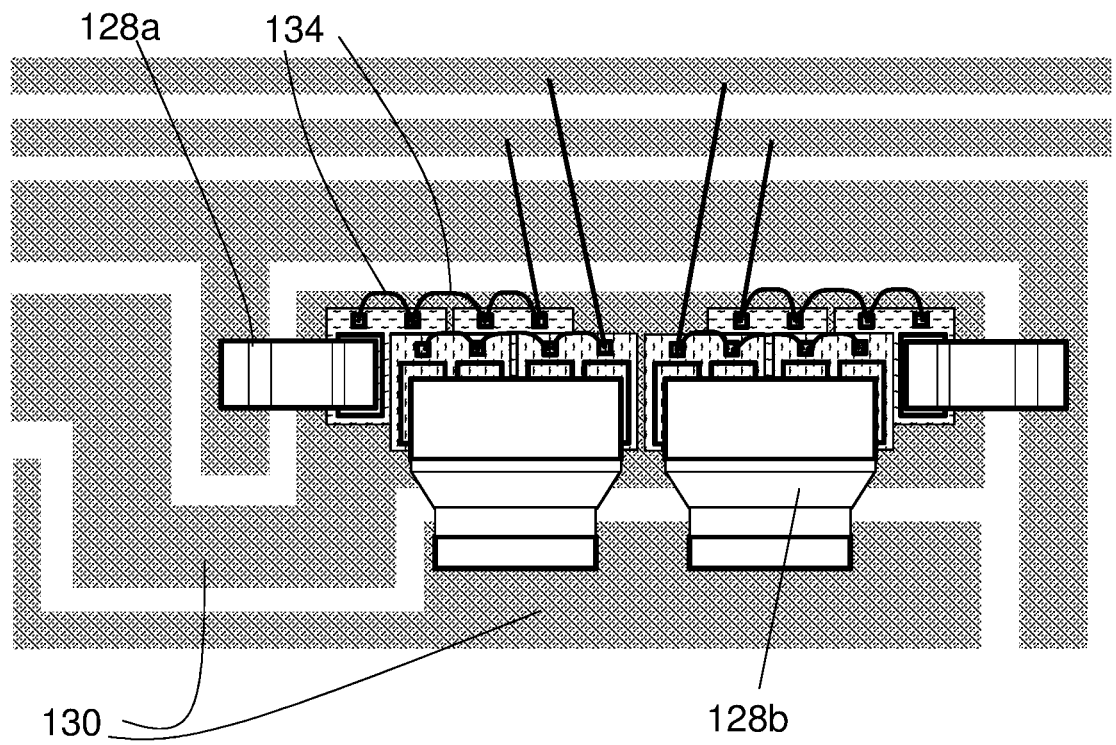
FIGS. 23*a* and 23*b* are respectively a top view and a side view of the first quadrant of the power module of FIG. 19, in which the top chips, the bottom chips, metal clips, wire bonding and passive components are shown.
Figure 23B:
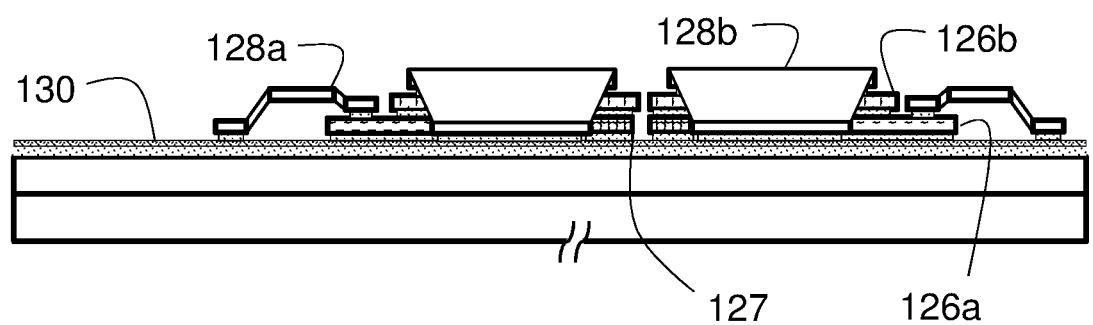

Turning to FIGS. 23a-23b, the stacked eight MOSFET chips 126 are connected with various bonding wires 134 and copper clips 128 to the conducting traces 130 on the substrate. In particular, the four, exposed gate pads 146 of the two bottom MOSFET chips 126a on each side of the spacers 127 are connected by bonding wires 134. Likewise, the four, exposed gate pads 146 of the two top MOSFET chips 126b near each one of the two spacers 127 are connected by bonding wires 134. The two exposed source pads 150 at the top side of each of the two end bottom MOSFET chips 126a is each connected by a narrower source Cu clip 128a to a same conducting trace 130. On the other side, the source pads 150 at the top side of all the top MOSFET chip 126b is connected to a same conducting trace 130 by two wider source Cu clips 128b. It should be noted that the conducting trace 130 connected to two narrower source Cu clips 128a is electrically isolated to the conducting trace 130 connected to two wide source Cu clips 128b. The wider source Cu clips 128b and the narrower source Cu clips 128a each contain multiple facets in sequence rather than a smooth, curved surface.

FIGS. 26a-34b show the three views of each of the second quadrant 132b, the third quadrant 132c, and the fourth quadrant 132d. Despite that horizontal orientations of the MOSFET chips 126 may be different between the quadrants, so are the shapes of conducting traces 130 in each quadrant, the structure of the stacked MOSFET chips 126 in each quadrant is substantially the same as well their wire or Cu clip bonding. Therefore the structures of the second quadrant 132b, the third quadrant 132c, and the fourth quadrant 132d will not be described in details for the sake of brevity.

Figure 35:
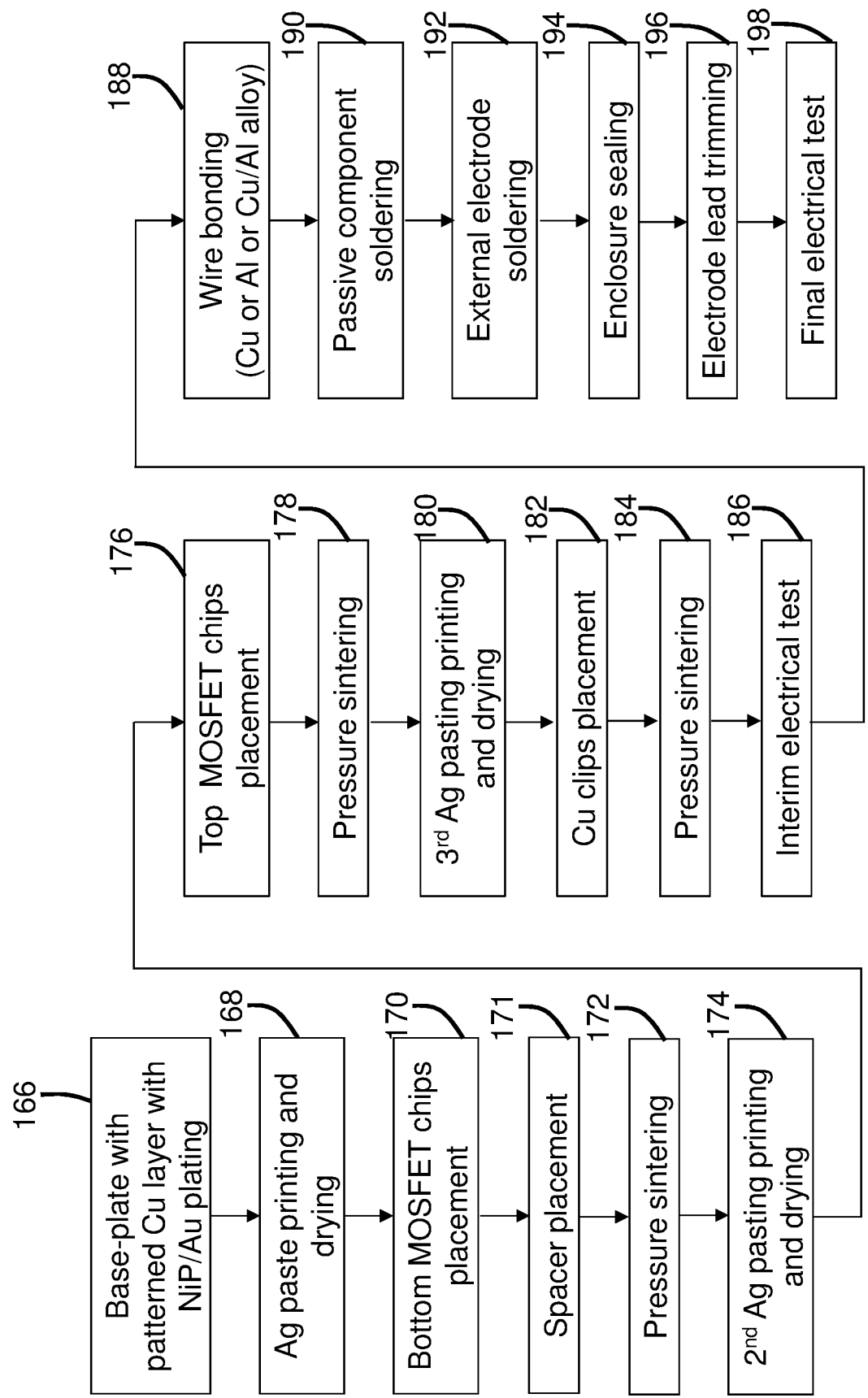
FIG. 35 is a flowchart showing the steps of a method of manufacturing the power module in FIGS. 19-34b.

Turning to FIG. 35, which shows the method of manufacturing the power module 118 in FIGS. 19-34b. The method starts at Step 166 in which the substrates 124 including the first substrate 124a and the second substrate 124b are prepared on the base plate 120b. The substrates 124 include the patterned conducting traces 130 of the nickel phosphorous and/or gold plating layers 144 and copper layers 142 on top of the ceramic layers 140 as shown in FIG. 21b. Then, in Step 168 Ag pastes (and in particular the drain Ag pastes 158a) are printed on the surface of the nickel phosphorus and/or gold plating layers 144 and dried, ready for mounting the bottom MOSFET chips 126a at their drain 164. It should be noted that in this step drain Ag pastes 158a for the two spacers 170 are also printed and dried on the first substrate 124a. In Step 170, the bottom MOSFET chips 126a are then placed at their designated locations on the first substrate 124a. It should be noted that all sixteen (16) bottom MOSFET chips 126a of the power module 118 are positioned on the first substrate 124a in this step. In Step 171, the spacers 127 are also placed on the first substrate 124a according to their designated locations as shown in FIG. 21a-21b, 26a-26b, 29a-29b and 32a-32b of corresponding quadrants. Then, in Step 172 pressure sintering is applied to the drain Ag pastes 158a between the first substrate 124a and the bottom MOSFET chips 126a as well as the spacers 127 to secure the bottom MOSFET chips 126a as well as the spacers 127 to the first substrate 124a. By now, the bottom MOSFET chips 126a are then finished with their mounting on the first substrate 124a. Next, in Step 174 Ag pastes (and in particular the source Ag pastes 158b) are printed on the top side of source pad 150 of all the bottom MOSFET chips 126a (except for the source pads 150 at the two end bottom MOSFET chips 126a as mentioned above) as well as the top side of two spacers 170 and dried, so that the bottom MOSFET chips 126a and spacers 170 are ready for top MOSFET chips 126b to stack thereon. In Step 176, the top MOSFET chips 126b are then placed at their designated locations on the bottom MOSFET chips 126a as shown in FIGS. 22a-22b, 27a-27b, 30a-30b and 33a-33b of corresponding quadrants. It should be noted that all sixteen (16) top MOSFET chips 126b of the power module 118 are positioned in this step and align to the bottom MOSFET chips 126a as shown in FIG. 24-25b. In Step 178, pressure sintering is applied to the source Ag pastes 158b between the top MOSFET chips 126b and the bottom MOSFET chips 126a to connect the source pads 150 of the bottom MOSFET chips 126a to their respective drain 164 of a top MOSFET chip 126b. By now, the stack structure of the top MOSFET chips 126b and the bottom MOSFET chips 126a are finished. Then, in Step 180 Ag pastes (and in particular the source Ag pastes 158b) are printed on the top side source pads 150 of all the top MOSFET chips 126b as well as on source pads 150 at the two end bottom MOSFET chips 126a as mentioned above, and dried so that the various MOSFET chips 126 are ready for connecting the bonding wires 134 and the Cu clips 128. In Step 182, the two exposed source pads 150 at the top side of each of the two end bottom MOSFET chip 126a each connected by a narrow source Cu clip 128a to a conducting trace 130, and the source pads 150 of the four top MOSFET chip 126b are connected to the conducting traces 130 by two wider source Cu clips 128b. Pressure sintering is then applied in Step 184 to the source pastes 158b so as to fix the Cu clips 128. Then in Step 186 an interim electrical test is conducted for power module 118 as its major components (i.e. the MOSFET chips 126) have been assembled. This step will ensure these major components are not been damaged during the manufacturing process before we move forward. Then, in Step 188 the all the gate pads 146 of the MOSFET chips 126 are connected by bonding wires 134 as described in the manner above. In Step 188, the first substrate 124a is also electrically connected to the second substrate 124b with the bonding wires 134 as mentioned previously. By now the power module 118 would have the structure as shown in FIGS. 23a-23b, 28a-28b, 31a-31b and 34a-34b of corresponding quadrants. In Step 190, gate resistor 136 are soldered to the first substrate 124a (as shown in FIG. 19). Next, external electrodes (not shown) that electrically connect the first substrate 124a are soldered, which become the seven electric terminals mentioned above. In Step 194, the cover (not shown) of the housing is sealed to the base 120b of the housing when the substrates 124 is placed therebetween, with the seven electric terminals positioned to respective openings (not shown) on the cover. In Step 196, the free ends of the external electrodes are trimmed so that they meet the manufacturing requirement of the power module 118 (e.g. the free ends do not extend out of the housing). Lastly, in Step 198 a final electrical test is conducted on the power module 118 and if the final electrical test is passed, then the power module 118 becomes read for packaging and shipment.

Figure 36:
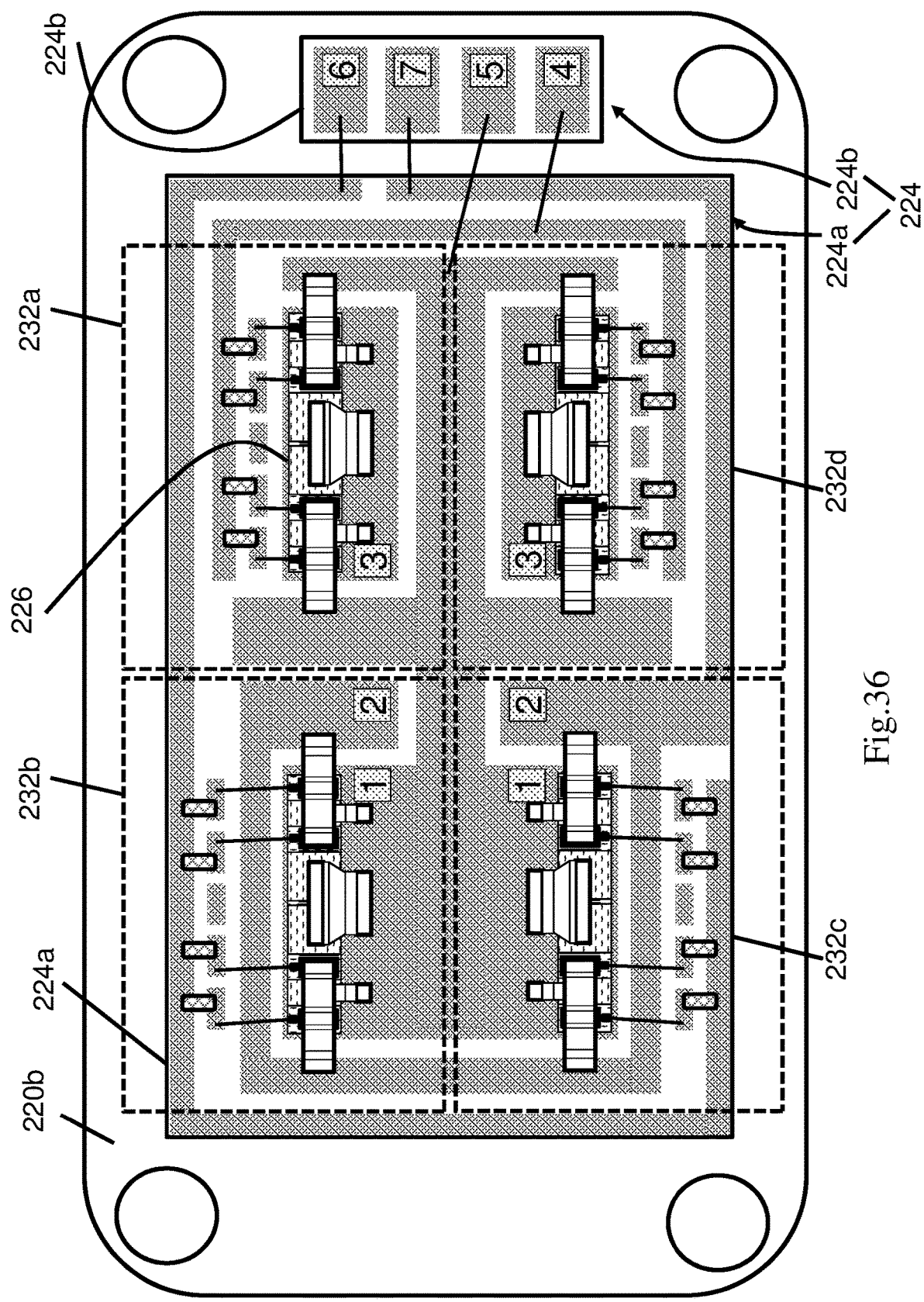
FIG. 36 is the interior layout view of MOSFET chips and the substrate in the power module according to a third embodiment of the invention.
Figure 37:
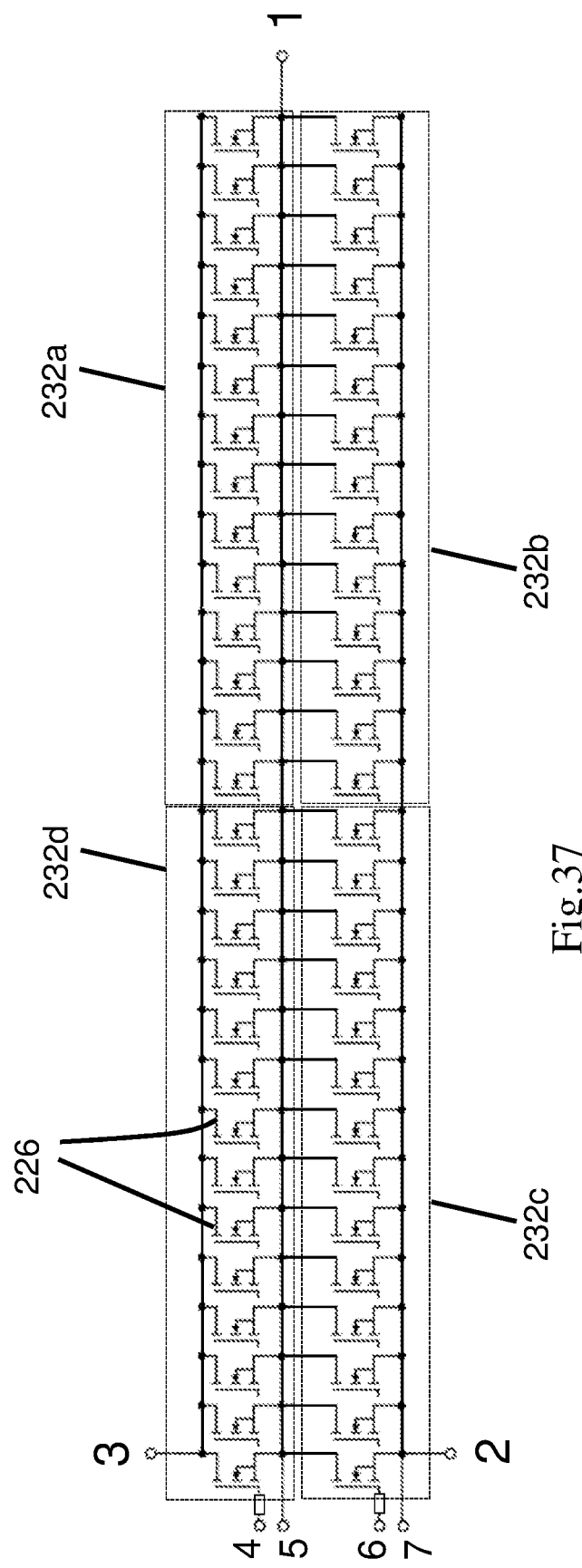
FIG. 37 shows the equivalent circuit of the power module of FIG. 36.

Turning to FIG. 36, which shows the internal structure of a power module 218 according to another embodiment of the invention. For the sake of brevity, only the differences between the power module 218 and the power module illustrated in FIGS. 2a-17b will be described herein. One should note that the power module 218 could have the same or different outside appearance (e.g. that of the cover of the housing) as that shown in FIG. 1. The power module 218 has two substrates 224 including a first substrate 224a and a second substrate 224b located in a base 220b of the housing of the power module 218. The first substrate 224a on its top side can also be divided into four quadrants 232a-232d, each receiving a sub-module. Compared to the embodiment shown in FIG. 2a-17b, the most significant difference is that the power module 218, while also using a parallel chip stacking option for all MOSFET chips 226, contains much more MOSFET chips 226 in the sub-module in each quadrant 232a-232d. Each MOSFET chip 226 is identical (and it also could be different) with that in the embodiment shown in FIGS. 2a-17b. An equivalent circuit of the power module 218 is shown in FIG. 37, in which one can see that the sub-modules in the first quadrant 232a and the fourth quadrant 232d are connected in parallel, and the same is between sub-modules in the second quadrant 232b and the third quadrant 232c. However, the sub-module in the first quadrant 232a is connected in series with the sub-module in the second quadrant 232b, and the sub-module in the third quadrant 232c is connected in series with the sub-module in the fourth quadrant 232d. As such, a first quadrant 232a and a fourth quadrant 232d are on the high-side, and a second quadrant 232b as well as a third quadrant 232c are on a low-side.

In this embodiment, there are fourteen MOSFET chips 226 in each quadrant, which has 2.8 to 3.5 times the power density of conventional power modules. Instead of using two layers of MOSFET chips as in the embodiments of FIGS. 1-35, there are four layers of MOSFET chips 226 configured in a stacked structure. The four layers of MOSFET chips 226 include the followings: five bottom MOSFET chips 226a to be placed on the first substrate 224a in each quadrant, four first middle MOSFET chips 226c stacked on the bottom MOSFET chips 226a with source pads 250 and gate pads 246 of the first middle MOSFET chips 226c facing down, three second middle MOSFET chips 226d stacked on the first middle MOSFET chips 226c with source pads 250 and gate pads 246 of the second middle MOSFET chips 226d facing up again, and finally two top MOSFET chips 226b stacked on the second middle MOSFET chips 226d with source pads 250 and gate pads 246 of the top MOSFET chips 226b facing down.

Figure 38A:
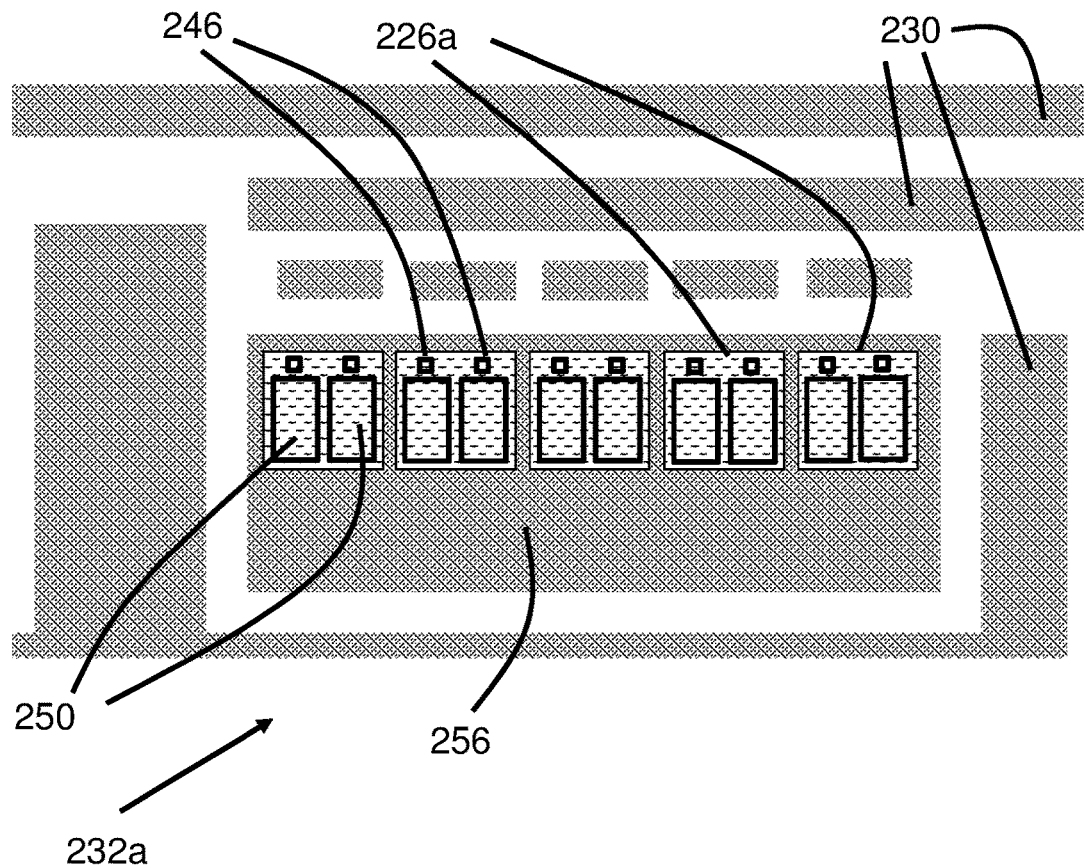
FIGS. 38a and 38b are respectively a top view and a side view of a first quadrant of the power module of FIG. 36, in which only bottom chips are shown as bonded to the substrate.
Figure 38B:
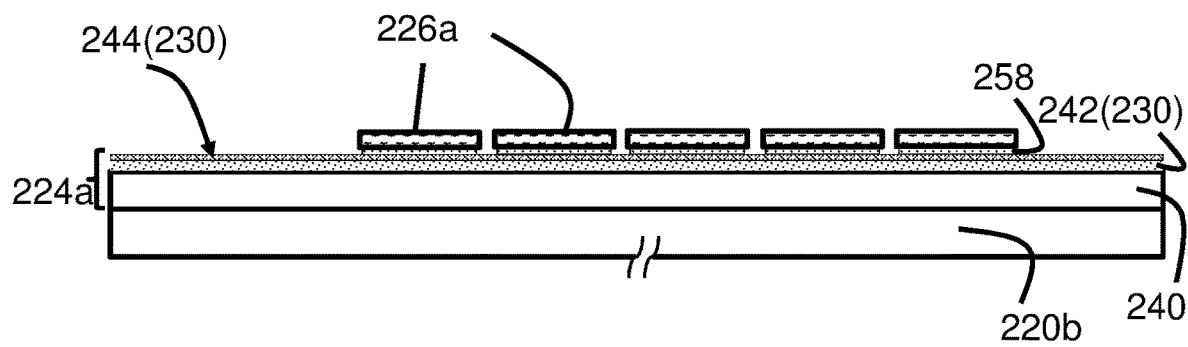

Turning to FIGS. 38a and 38b, in the first quadrant 232a there are five bottom MOSFET chips 226a installed on top of the first substrate 224a and in particular as mounted on nickel phosphorus and/or gold plating layers 244 on the first substrate 224a. The above-mentioned nickel phosphorus and/or gold plating layers 244, together with copper layers 242 on the surface of the first substrate 224a forms various conducting traces 230 and a drain area 256, and are isolated by ceramic layer 240. The five bottom MOSFET chips 226a are evenly distributed on the drain area 256 along a length thereof. In other words, the distance between any two adjacent bottom MOSFET chips 226a is the same. To obtain the best effect, the source pad 250 spacing between two adjacent bottom MOSFET chips 226a must be the same as two source pads 250 within any one of the bottom MOSFET chip 226a. All the bottom MOSFET chips 226a have their top side facing upward. As such, on the top sides of the bottom MOSFET chips 226a there are two gate pads 246 and two source pads 250. The drain (not shown) of the bottom MOSFET chips 226a are physically and electrically bonded to the nickel phosphorus and/or gold plating layers 244 by Ag pastes 258.

Figure 39A:
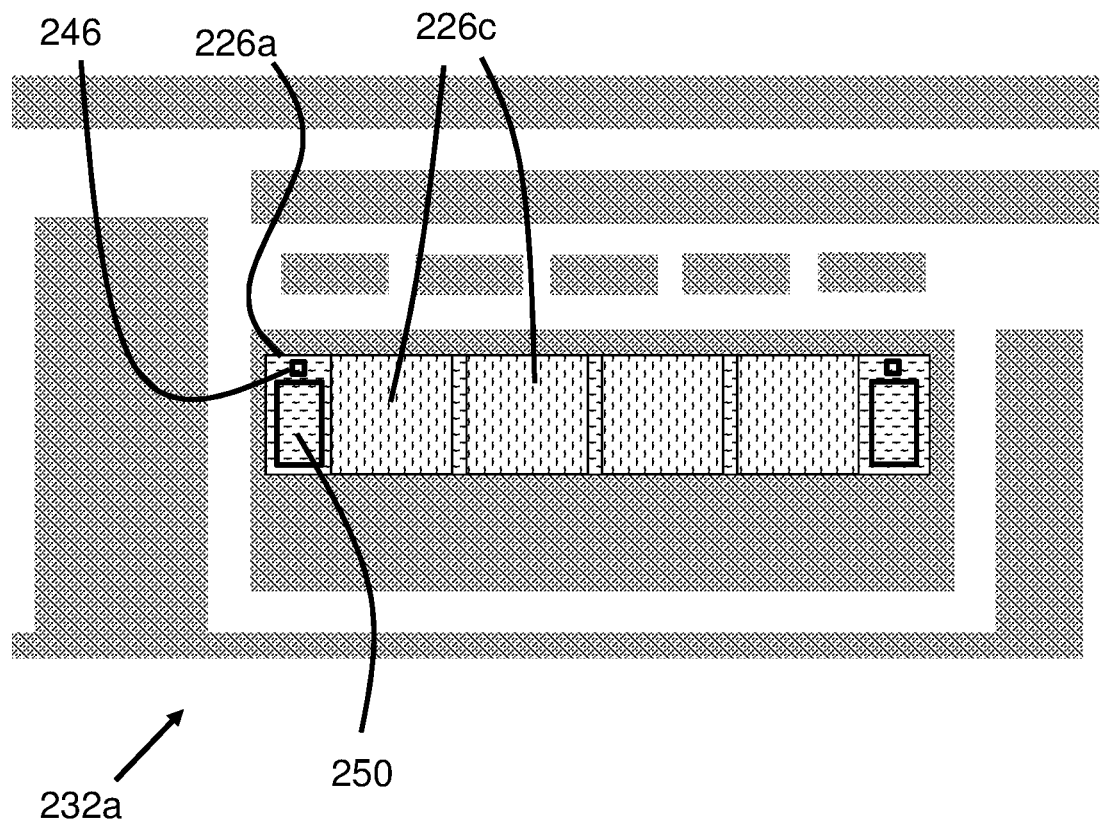
FIGS. 39a and 39b are respectively a top view and a side view of the first quadrant of the power module of FIG. 36, in which both first middle chips and bottom chips are shown.
Figure 39B:
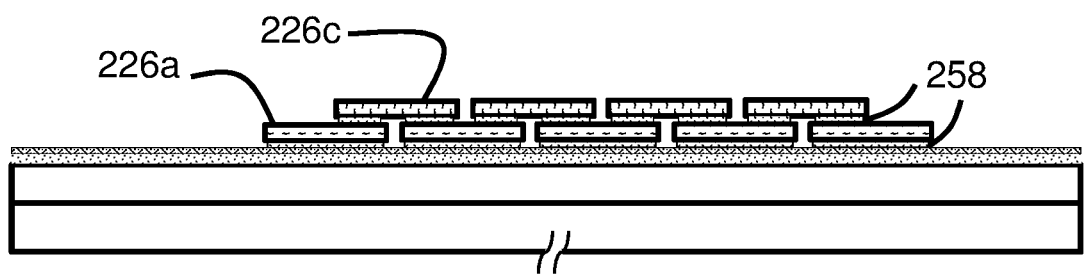

Turning to FIG. 39a-39b, where the first middle MOSFET chips 226c are shown to be stacked on the top side of the bottom MOSFET chips 226a. There are four first middle MOSFET chips 226c in the first quadrant 232a, and they are evenly distributed on top of the five bottom MOSFETs 226a. In particular, all the bottom MOSFET chips 226a and the first middle MOSFET chips 226c are identical, and each first middle MOSFET chip 226c is exactly stacked on two bottom MOSFET chips 226a, and that the overlapping area of the first middle MOSFET chip 226c with either of the two bottom MOSFET chips 226a is the same. In other words, every first middle MOSFET chip 226c is evenly positioned between the two adjacent bottom MOSFET chips 226a in a direction perpendicular to a stacking direction. The distance between any two adjacent first middle MOSFET chips 226c is also the same as the distance between any two adjacent bottom MOSFET chips 226a. It should be noted that the bottom MOSFET chips 226a have their source pads 250 and gate pads 246 facing up, while the first middle MOSFET chips 226c are flipped to have their source and gate pads (not shown) facing down. In addition, among the five bottom MOSFET chips 226a, three of them are completely covered by the first middle MOSFET chips 226c, but the two bottom MOSFET chips 226a at opposite ends of the drain area 256 are not fully covered. Rather, each of the two bottom MOSFET chips 226a has one gate pad 246 and one source pad 250 exposed, which are used to make either wire bonding or copper clip bonding to the conducting traces 230. Between the first middle MOSFET chips 226c and the bottom MOSFET chips 226a, Ag pastes 258 are configured to allow electrical connection therebetween.

Figure 40A:
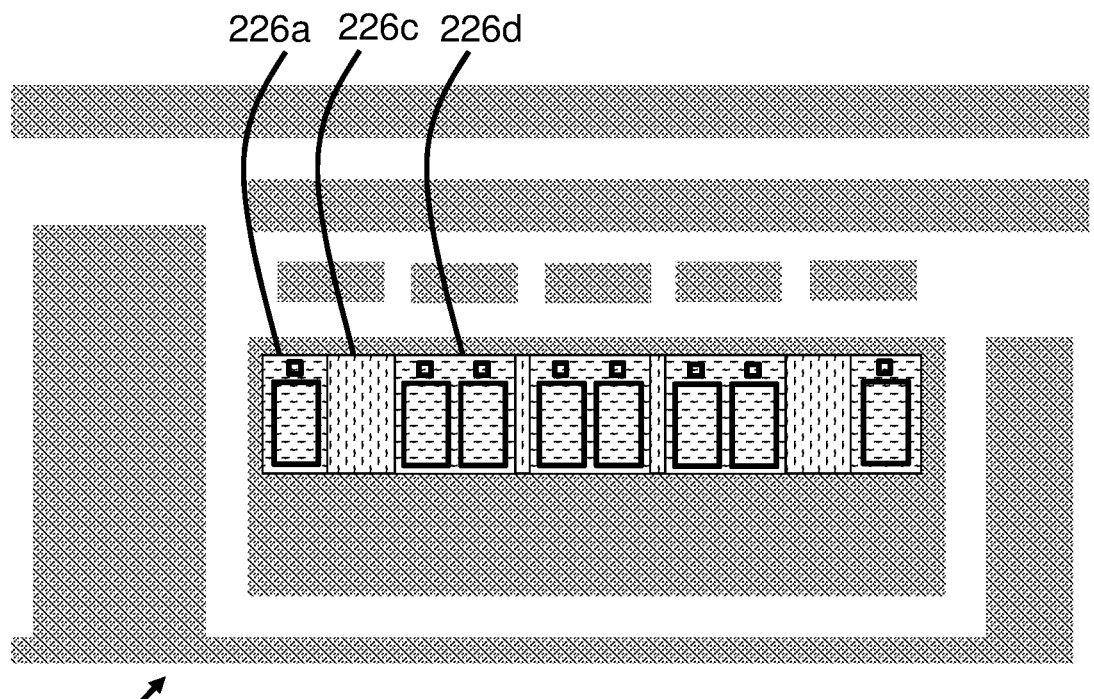
FIGS. 40a and 40b are respectively a top view and a side view of the first quadrant of the power module of FIG. 36, in which second middle chips, the first middle chips and the bottom chips are shown.
Figure 40B:
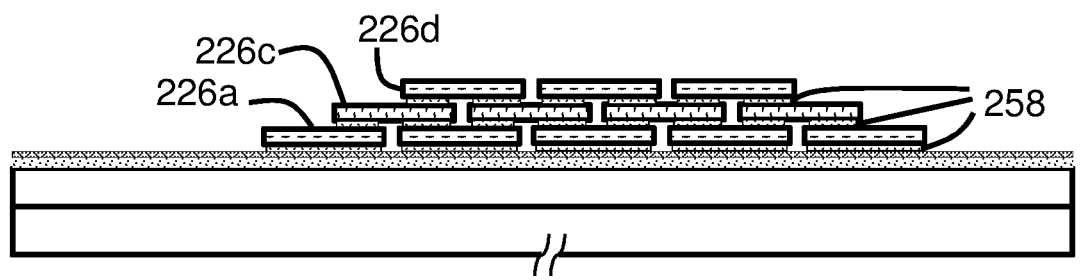

The opposite orientations of the bottom MOSFET chips 226a and the first middle MOSFET chips 226c and how they are connected electrically are similar to what have been described above with regards to FIGS. 8a-8c, so for the sake of brevity they are not described herein again. Turning to FIGS. 40a and 40b, which show that on top of the first middle MOSFET chips 226c there are three second middle MOSFET chips 226d stacked. The second middle MOSFET chips 226d are evenly distributed on top of the four first middle MOSFETs 226c. In particular, all the first middle MOSFET chips 226c and the second middle MOSFET chips 226d are identical, and each second middle MOSFET chip 226d is exactly stacked on two first middle MOSFET chips 226c, and that the overlapping area of the second middle MOSFET chip 226d with either of the two first middle MOSFET chips 226c is the same. In other words, every second middle MOSFET chip 226d is evenly positioned between the two adjacent first middle MOSFET chips 226c in a direction perpendicular to a stacking direction. The distance between any two adjacent second middle MOSFET chips 226d is also the same as the distance between any two adjacent first middle MOSFET chips 226c. It should be noted that the first middle MOSFET chips 226c have their source pads 250 and gate pads 246 (not shown) facing down, but the second middle MOSFET chips 226d have their source and gate pads facing up just like the bottom MOSFET chips 226a. Therefore, the first middle MOSFET chips 226c are electrically connected to the second middle MOSFET chips 226d via their drain. As all the first middle MOSFET chips 226c are facing down, there is no source pad 250 or gate pad 246 of the first middle MOSFET chips 226c exposed. Between the second middle MOSFET chips 226d and the first middle MOSFET chips 226c, Ag pastes 258 are configured to allow electrical connection therebetween.

Figure 41A:
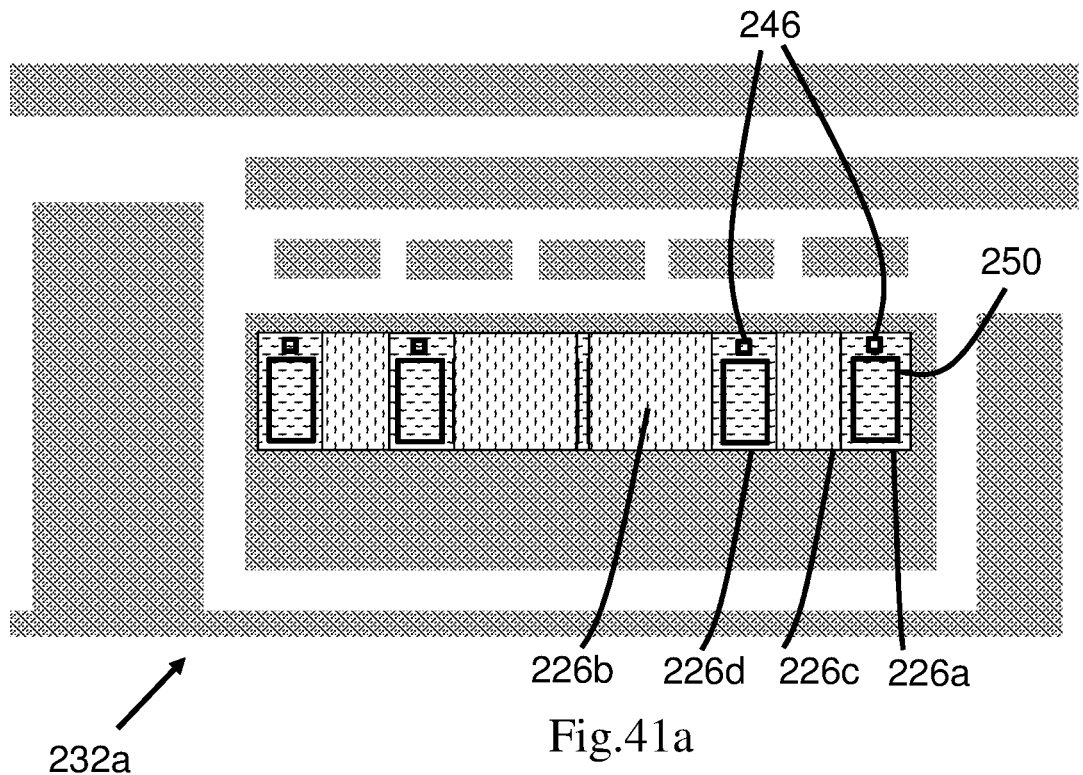
FIGS. 41a and 41b are respectively a top view and a side view of the first quadrant of the power module of FIG. 36, in which top chips, the second middle chips, the first middle chips and the bottom chips are shown.
Figure 41B:
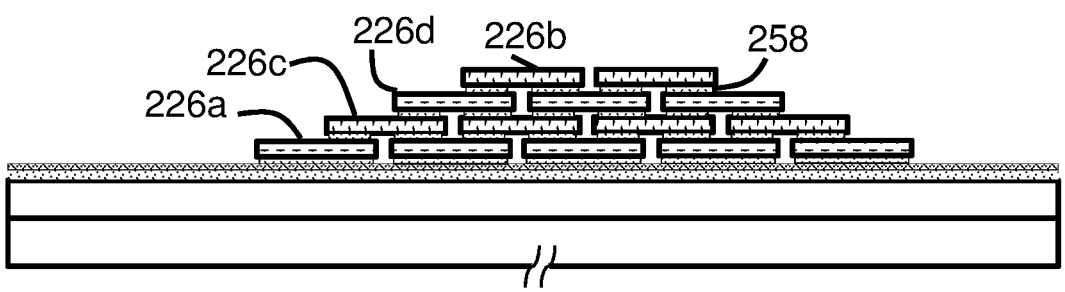

Turning to FIGS. 41a and 41b, which show that on top of the second middle MOSFET chips 226d there are two top MOSFET chips 226b stacked. The top MOSFET chips 226b are evenly distributed on top of the three second middle MOSFETs 226d. In particular, all the top MOSFET chips 226b and the second middle MOSFET chips 226d are identical, and each top MOSFET chip 226b is exactly stacked on two second middle MOSFET chips 226d, and that the overlapping area of the top MOSFET chip 226b with either of the two second middle MOSFET chips 226d is the same. In other words, every top MOSFET chip 226b is evenly positioned between the two adjacent second middle MOSFET chips 226d in a direction perpendicular to a stacking direction. The distance between the two top MOSFET chips 226b is also the same as the distance between any two adjacent second middle MOSFET chips 226d. It should be noted that the top MOSFET chips 226b have their source pads 250 and gate pads 246 facing down just like the first middle MOSFET chips 226c. In addition, among the three second middle MOSFET chips 226d, only one of them is are completely covered by the top MOSFET chips 226b, but the two second middle MOSFET chips 226d at the ends of the line at which the three second middle MOSFET chips 226d are located at are not fully covered. Rather, each of the two second middle MOSFET chips 226d has one gate pad 246 and one source pad 250 exposed, which are used to make either wire bonding or copper clip bonding to the conducting traces 230. Between the second middle MOSFET chips 226d and the top MOSFET chips 226b, Ag pastes 258 are configured to allow electrical connection therebetween.

Figure 42A:
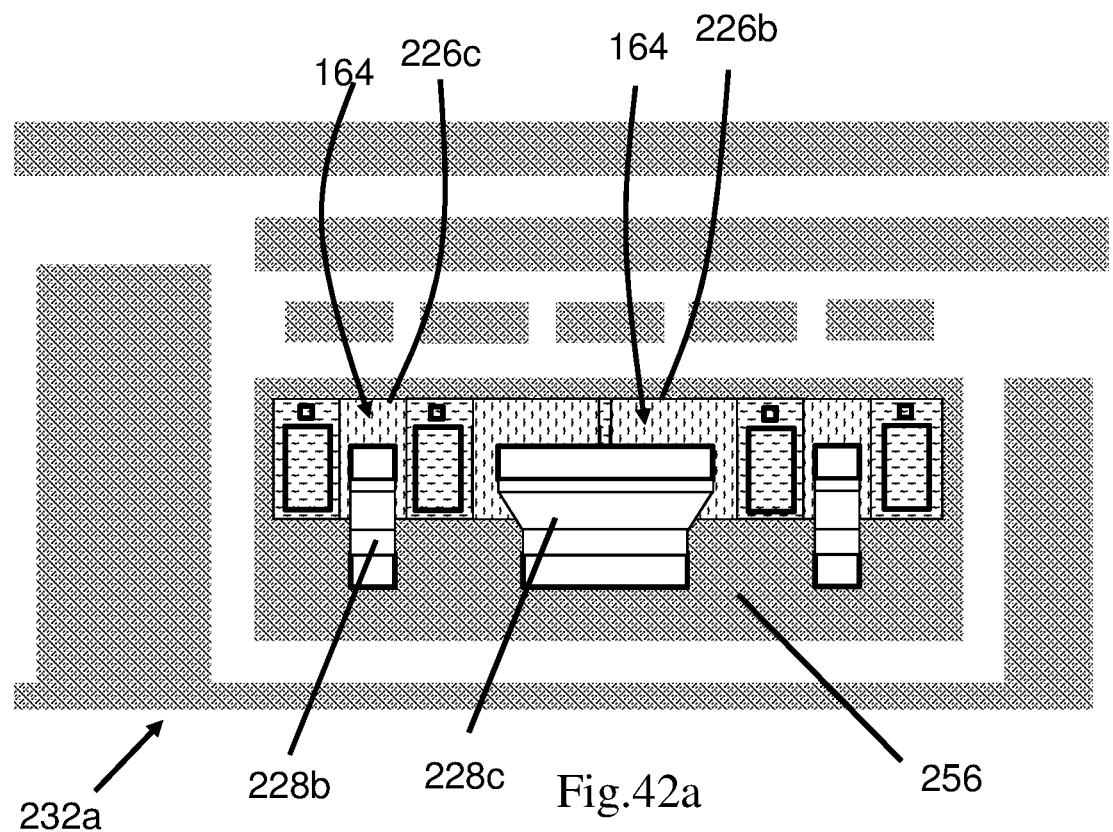
FIGS. 42a and 42b are respectively a top view and a side view of the first quadrant of the power module of FIG. 36, in which the top chips, the second middle chips, the first middle chips, the bottom chips, and part of the metal clips are shown.
Figure 42B:
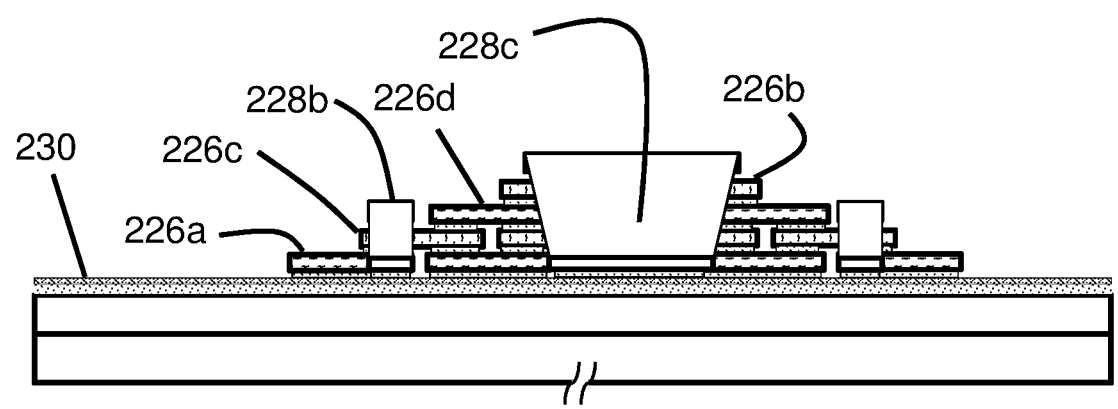
Figure 43A:
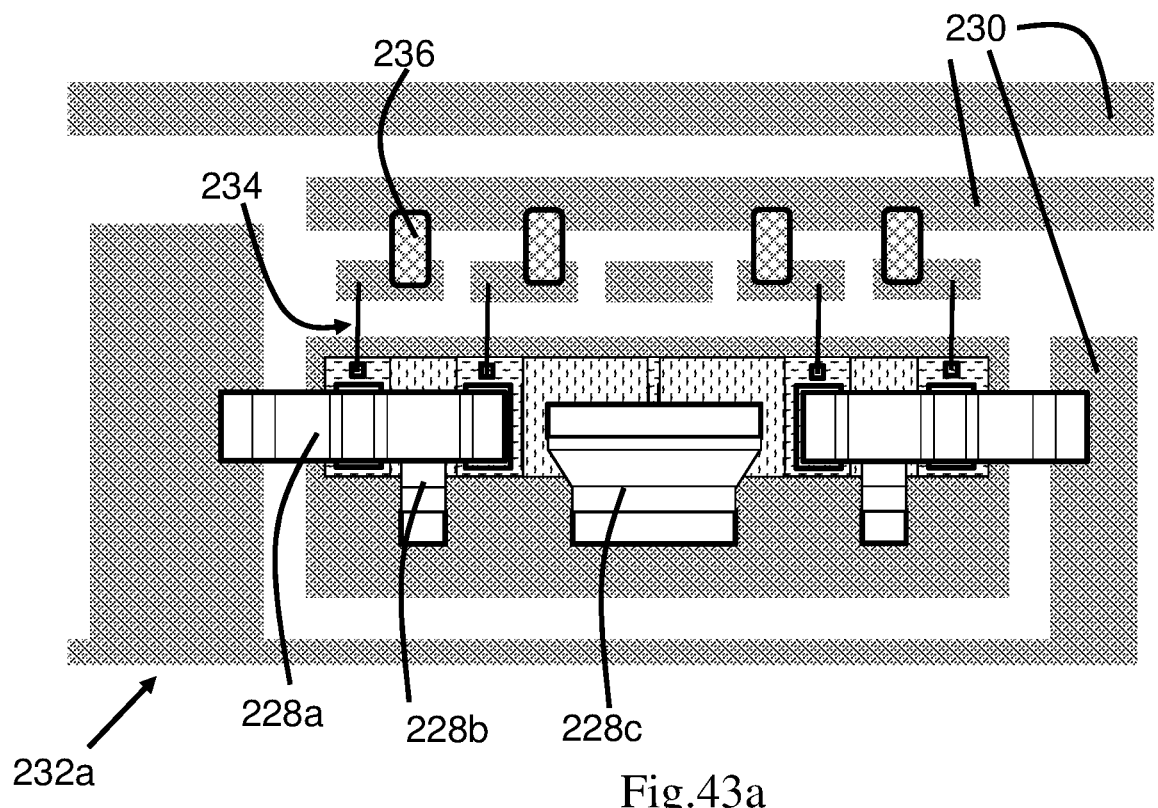
FIGS. 43a and 43b are respectively a top view and a side view of the first quadrant of the power module of FIG. 36, in which the top chips, the second middle chips, the first middle chips, the bottom chips, all the metal clips, and passive components are shown.
Figure 43B:
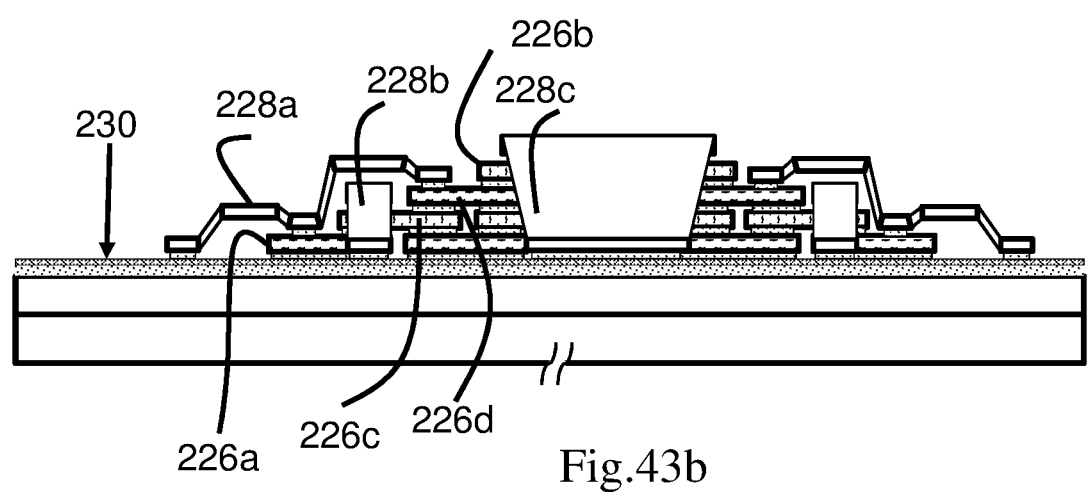

FIGS. 42a-42b show the first quadrant 232a of power module 218 with all the MOSFET chips 226 present, and drain Cu clips including two narrower Cu clips 228b and one wider Cu clip 228c. The narrower drain Cu clips 228b each connects the drain 164 of a first middle MOSFET chip 226c at an end to a drain area 256. In the meantime, the wider drain Cu clip 228c connects the drain 164 of the two top MOSFET chips 226b to the same drain area 256 to which the two first middle MOSFET chip 226c are connected. FIGS. 43a-43b on the other hand show the complete structure in the first quadrant 232a, and in particular gate resistors 236 as passive components that are connected between two conducting traces 230, and bonding wires 234 connecting exposed gate pads 246 of the two bottom MOSFET chips 226a at the ends, as well as the two second middle MOSFET chips 226d at the ends. In addition, a source Cu clip 228a connects the source pads 250 of both the bottom MOSFET chip 226a and the second middle MOSFET chip 226d at each end to a conducting trace 230. All the Cu clips are connected to respective surfaces of the first substrate 224a or MOSFET chips 226 using Ag pastes as mentioned previously.

In the embodiment described above, the bottom MOSFET chips 226a are connected in parallel with the first middle MOSFET chips 226c. The first middle MOSFET chips 226c are connected in parallel with the second middle MOSFET chips 226d. The second middle MOSFET chips 226d are connected in parallel with the top MOSFET chips 226b. Thus, all the MOSFET chips 226 in the first quadrant 232a are connected in parallel. The other three quadrants 232b-232d have similar structures of the stacked MOSFET chips 226 as well as their wire or Cu clip bonding like the first quadrant 232a, although the horizontal orientations of the MOSFET chips 226 may be different between the quadrants, so are the shapes of conducting traces 230 in each quadrant. The structures of the second quadrant 232b, the third quadrant 232c, and the fourth quadrant 232d will not be described in details for the sake of brevity.

Figure 44:
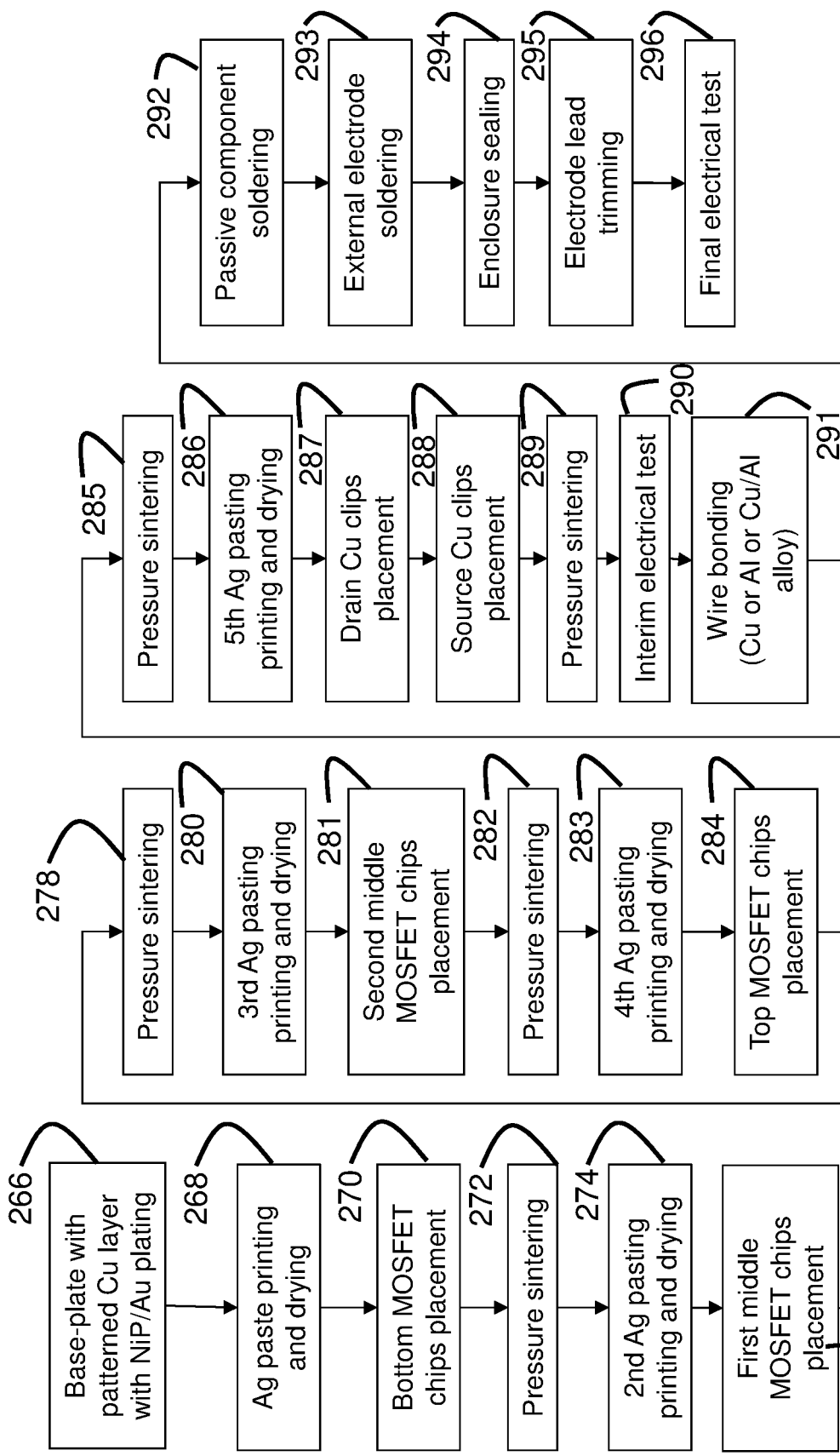
FIG. 44 is a flowchart showing the steps of a method of manufacturing the power module in FIGS. 36-43b.

Turning to FIG. 44, which shows the method of manufacturing the power module 218 in FIGS. 36-43b. The method starts at Step 266 in which the substrates 224 including a first substrate 224a and a second substrate 224b is prepared on the base plate 220b. This substrates 224 includes the patterned conducting traces 230 of the nickel phosphorus and/or gold plating layer 244 and copper layers 242, on top of the ceramic layers 240 as shown in FIG. 38b. Then, in Step 268 Ag pastes (and in particular the drain Ag pastes 258) are printed on the surface of the nickel phosphorus and/or gold plating layer 244 and dried, ready for mounting the bottom MOSFET chips 226a at their drain. In Step 270, the bottom MOSFET chips 226a are them placed at their designated locations on the first substrate 224a as shown in FIG. 38a-38b. It should be noted that all twenty (20) bottom MOSFET chips 226a in the four quadrants 232a-232d of the power module 218 are positioned on the first substrate 224a in this step. In Step 172 pressure sintering is applied to the drain Ag pastes between the first substrate 224a and the bottom MOSFET chips 226a to secure the bottom MOSFET chips 226a to the first substrate 224a. By now, the bottom MOSFET chips 226a are then finished with their mounting on the first substrate 224a as shown in FIGS. 38a and 38b of the first quadrant for example. Next, in Step 274 Ag pastes (and in particular the source Ag pastes and the gate Ag pastes) are printed on the top side of all the bottom MOSFET chips 226a (except for the two exposed gate pads 246 and source pads 250 at the two end bottom MOSFET chips 226a as mentioned above) and dried, so that the bottom MOSFET chips 226a are ready for the first middle MOSFET chips 226c to stack thereon. In Step 276, the first middle MOSFET chips 226c are then placed at their designated locations on the bottom MOSFET chips 226a as shown in FIGS. 39a and 39b for example. It should be noted that all sixteen (16) first middle MOSFET chips 226c of the power module 218 are positioned in this step and align to the bottom MOSFET chips 226a as shown in FIG. 8a-8c. In Step 278, pressure sintering is applied to the source Ag pastes between the first middle MOSFET chips 226c and the bottom MOSFET chips 226a to connect the source pads 250 of the bottom MOSFET chips 226a to their respective source pad 250 of a first middle MOSFET chip 226c.

Then, in Step 280 Ag pastes (and in particular the drain Ag pastes) are printed on the top side of all the first middle MOSFET chips 226c and dried. In Step 281 the second middle MOSFET chips 226d are placed on top of the first middle MOSFET chips 226c and in Step 282 the Ag pastes between the second middle MOSFET chips 226d and the first middle MOSFET chips 226c are subjected to pressure sintering. In Step 283 Ag pastes (and in particular the source Ag pastes and the gate Ag pastes) are printed on the top side of all the second middle MOSFET chips 226d and dried. In Step 284 the top MOSFET chips 226b are placed on top of the second middle MOSFET chips 226d and in Step 285 the Ag pastes between the second middle MOSFET chips 226d and the top MOSFET chips 226b are subjected to pressure sintering. In Step 286 Ag pastes are printed on exposed drain of two top MOSFET chips 226b, exposed drain at the two ends of first middle MOSFET chips 226c, the source pads at the two ends of second middle MOSFET chips 226d and source pads at the two ends of bottom MOSFET chips 226a as mentioned above. In Step 287 the narrower Cu clips 228b and the wider Cu clips 228c are placed on the respective first middle MOSFET chips 226c and the top MOSFET chip 226b. In Step 288 the source Cu clips 228a are placed and in contact with the respective bottom MOSFET chip 226a and the second middle MOSFET chips 226d. Then, all the Ag pastes at the contact portions of the Cu clips are subjected to pressure sintering in Step 289. Then in Step 290 an interim electrical test is conducted for power module 218 as its major components (i.e. the MOSFET chips 226) have been assembled.

In Step 291 the exposed gate pads 246 of the bottom MOSFET chips 226a and second middle MOSFET chips 226d at the hand are soldered with bonding wires 234 to respective conducting traces 230 which in Step 292 are connected with gate resistors 236. In Step 291, the first substrate 224a is also electrically connected to the second substrate 224b with the bonding wires 234 as mentioned previously. Next, in Step 293 external electrodes (not shown) that electrically connect the substrates 224 are soldered, which become the seven electric terminals mentioned above. In Step 294, the cover (not shown) of the housing is sealed to the base 220b of the housing when the substrates 224 is placed therebetween, with the seven electric terminals positioned to respective openings (not shown) on the cover. In Step 295, the free ends of the external electrodes are trimmed so that they meet the manufacturing requirement of the power module 218 (e.g. the free ends do not extend out of the housing). Lastly, in Step 296 a final electrical test is conducted on the power module 218 and if the final electrical test is passed, then the power module 218 becomes read for packaging and shipment.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

Various embodiments described above include 2-layers or 4-layers stack of MOSFET chips. However, those skilled in the art should realize that the number of layers is not restricted to as such. Rather, using the same principle, in other embodiments one can expect the number of MOSFET layers can extend to the tip of the pyramid structure as long as the heat dissipation is under control. The formula for calculating the total number Y of MOSFET chips that can be stacked using the principle of the invention, is:

$$Y = X + X(X-1)/2$$

Although in the embodiments mentioned above the MOSFET chips are SiC MOSFETs, it should be understood that the invention is not limited by the type of MOSFET. Rather, as long as the multiple MOSFETs as building blocks are identical in dimension the stack structure of the invention can be applied. For example, silicon MOSFETs (not SiC), can also be used.

Although in the embodiments mentioned above the power module package is the 62 mm power module, it should be understood that the invention is not limited by package type. Rather, the invention can be applied to packages such as 34 mm, EasyPACK™, EconoPACK™, XHP™, XM3, GM3, HP 62 mm, etc. as long as the power module is in half-bridge configuration.

What is claimed is:

1. A semiconductor chip stack module, comprising:
   a substrate;
   two first semiconductor chips supported by the substrate; and
   a second semiconductor chip stacked on both of the two first semiconductor chips;
   wherein the second semiconductor chip is electrically connected to both of the two first semiconductor chips by a conductive paste configured between the second semiconductor chip and the both of the two first semiconductor chips.

2. The semiconductor chip stack module of claim 1, further comprising
   comprises a metal clip bond electrically connecting the second semiconductor chip to the substrate.

3. The semiconductor chip stack module of claim 2, wherein the second semiconductor chip is a MOSFET chip having a source at its top face; the metal clip bonding electrically connecting the source of the MOSFET chip to the substrate.

4. The semiconductor chip stack module of claim 2, wherein the at least one of the two first semiconductor chips is electrically connected at its top face to the substrate by a further metal clip bonding.

5. The semiconductor chip stack module of claim 3, wherein the second semiconductor chip further has a gate at its top face; the gate being electrically connected to the substrate via wire bonding.

6. The semiconductor chip stack module of claim 1, wherein the second semiconductor chip is connected in series to both of the first semiconductor chips.

7. The semiconductor chip stack module of claim 6, wherein the second semiconductor and the first semiconductor chips have a same pin layout, and corresponding pins in the second semiconductor and the first semiconductor chips face a same direction.

8. The semiconductor chip stack module of claim 1, wherein the second semiconductor chip is connected in parallel to both of the first semiconductor chips.

9. The semiconductor chip stack module of claim 8, wherein the second semiconductor and the first semiconductor chips have a same pin layout, and the second semiconductor is flipped with respect to the first semiconductor chips such that corresponding pins in the second semiconductor and the first semiconductor chips face opposite directions.

10. The semiconductor chip stack module of claim 1, wherein the second semiconductor chip is evenly positioned between the two first semiconductor chips in a direction perpendicular to a stacking direction.

11. The semiconductor chip stack module of claim 1, wherein the second semiconductor chip and the two first semiconductor chips all have identical dimensions and have identical pin layouts.

12. The semiconductor chip stack module of claim 1, further containing a further second semiconductor chip supported together by a spacer configured on the substrate and one of the two first semiconductor chips.

13. The semiconductor chip stack module of claim 1, further containing a further second semiconductor chip and a third semiconductor chip; the third semiconductor chip being supported by the second semiconductor chip and the further second semiconductor chip.

14. The semiconductor chip stack module of claim 1, wherein the substrate is divided into four quadrants, one quadrant of the substrate individually comprising said two first semiconductor chips and said one second semiconductor chip, wherein the other three quadrants each include:
 two respective semiconductor chips supported by the substrate; and
 a respective second semiconductor chip stacked on both of the two respective first semiconductor chips;
 wherein the second respective semiconductor chip is electrically connected to both of the two respective first semiconductor chips by a conductive paste configured between the respective second semiconductor chip and the both of the two respective first semiconductor chips.

\* \* \* \* \*

UNITED STATES PATENT AND TRADEMARK OFFICE
CERTIFICATE OF CORRECTION

PATENT NO. : 11,984,432 B2
APPLICATION NO. : 17/533421
DATED : May 14, 2024
INVENTOR(S) : Kuk Fong Yip It is certified that error appears in the above-identified patent and that said Letters Patent is hereby corrected as shown below:

In the Claims

Column 20, Claim 2, Line 60-61:
"further comprising comprises a metal clip bond electrically connecting the"

Should be:
-- further comprising a metal clip bond electrically connecting the --

Signed and Sealed this
Second Day of July, 2024

Katherine Kelly Vidal
*Director of the United States Patent and Trademark Office*